US010155382B2

(12) United States Patent
Iida

(10) Patent No.: US 10,155,382 B2
(45) Date of Patent: Dec. 18, 2018

(54) DEVICE USING A PIEZOELECTRIC ELEMENT AND METHOD FOR MANUFACTURING THE SAME

(71) Applicant: ROHM CO., LTD., Kyoto (JP)

(72) Inventor: Kunio Iida, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/665,833

(22) Filed: Aug. 1, 2017

(65) Prior Publication Data
US 2018/0050540 A1    Feb. 22, 2018

(30) Foreign Application Priority Data

Aug. 4, 2016    (JP) ................................. 2016-153901

(51) Int. Cl.
| | |
|---|---|
| B41J 2/14 | (2006.01) |
| B41J 2/16 | (2006.01) |
| H01L 41/047 | (2006.01) |
| H01L 41/332 | (2013.01) |
| H01L 41/09 | (2006.01) |

(52) U.S. Cl.
CPC .......... *B41J 2/14233* (2013.01); *B41J 2/161* (2013.01); *B41J 2/1628* (2013.01); *B41J 2/1629* (2013.01); *B41J 2/1631* (2013.01); *B41J 2/1632* (2013.01); *B41J 2/1642* (2013.01); *B41J 2/1646* (2013.01); *H01L 41/047* (2013.01); *H01L 41/0973* (2013.01); *H01L 41/332* (2013.01); *B41J 2002/14241* (2013.01); *B41J 2002/14491* (2013.01)

(58) Field of Classification Search
CPC .... B41J 2/14233; B41J 2/1628; B41J 2/1646; B41J 2/1632; B41J 2/1631; B41J 2/1629; B41J 2/161; B41J 2/1642; B41J 2002/14241; B41J 2002/14491; H01L 41/332; H01L 41/0973; H01L 41/047
See application file for complete search history.

(56) References Cited

U.S. PATENT DOCUMENTS

2016/0072039 A1*    3/2016    Iida ...................... H01L 41/047
                                                        310/364

FOREIGN PATENT DOCUMENTS

JP    2013-119182 A    6/2013

* cited by examiner

*Primary Examiner* — Bradley Thies
(74) *Attorney, Agent, or Firm* — Chip Law Group

(57) ABSTRACT

An ink jet print head 1 includes: a pressure chamber (cavity) 7; a movable film formation layer 10 arranged on the pressure chamber 7 and including a movable film 10A defining a ceiling surface portion of the pressure chamber 7; a piezoelectric element 9 formed on the movable film 10A and including a lower electrode 11, a piezoelectric film 12 formed on the lower electrode 11, and an upper electrode 13 formed on the piezoelectric film 12; and first upper wiring 16. The upper electrode 13 includes a main electrode portion 13A constituting the piezoelectric element 9 and an extension portion 13B as second upper wiring drawn out of the main electrode portion 13A and connected to the first upper wiring 16. The first upper wiring 16 has a portion arranged between the extension portion 13B and the movable film formation layer 10, and, within this portion, the extension portion 13B is connected to the first upper wiring 16.

15 Claims, 21 Drawing Sheets

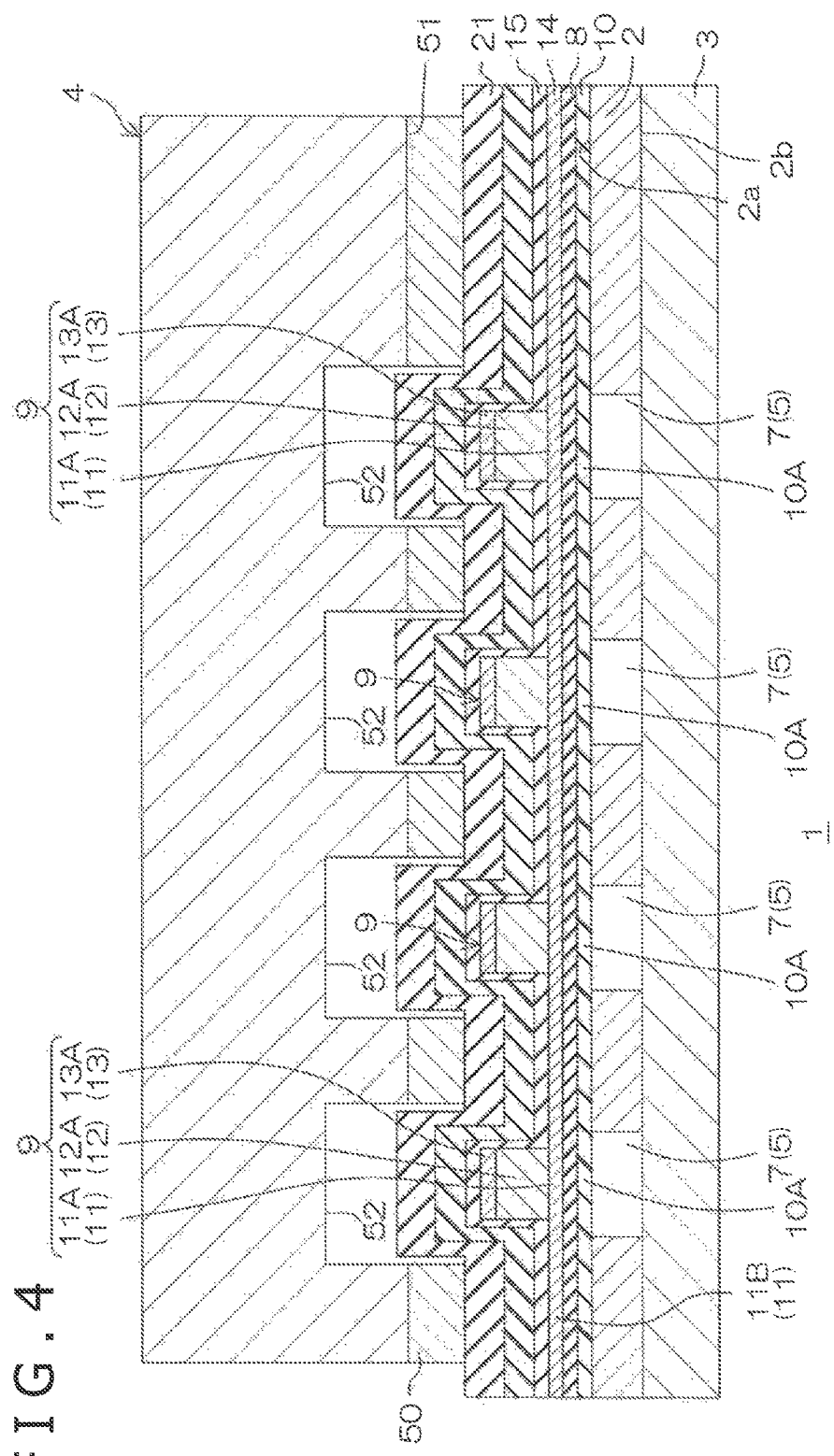

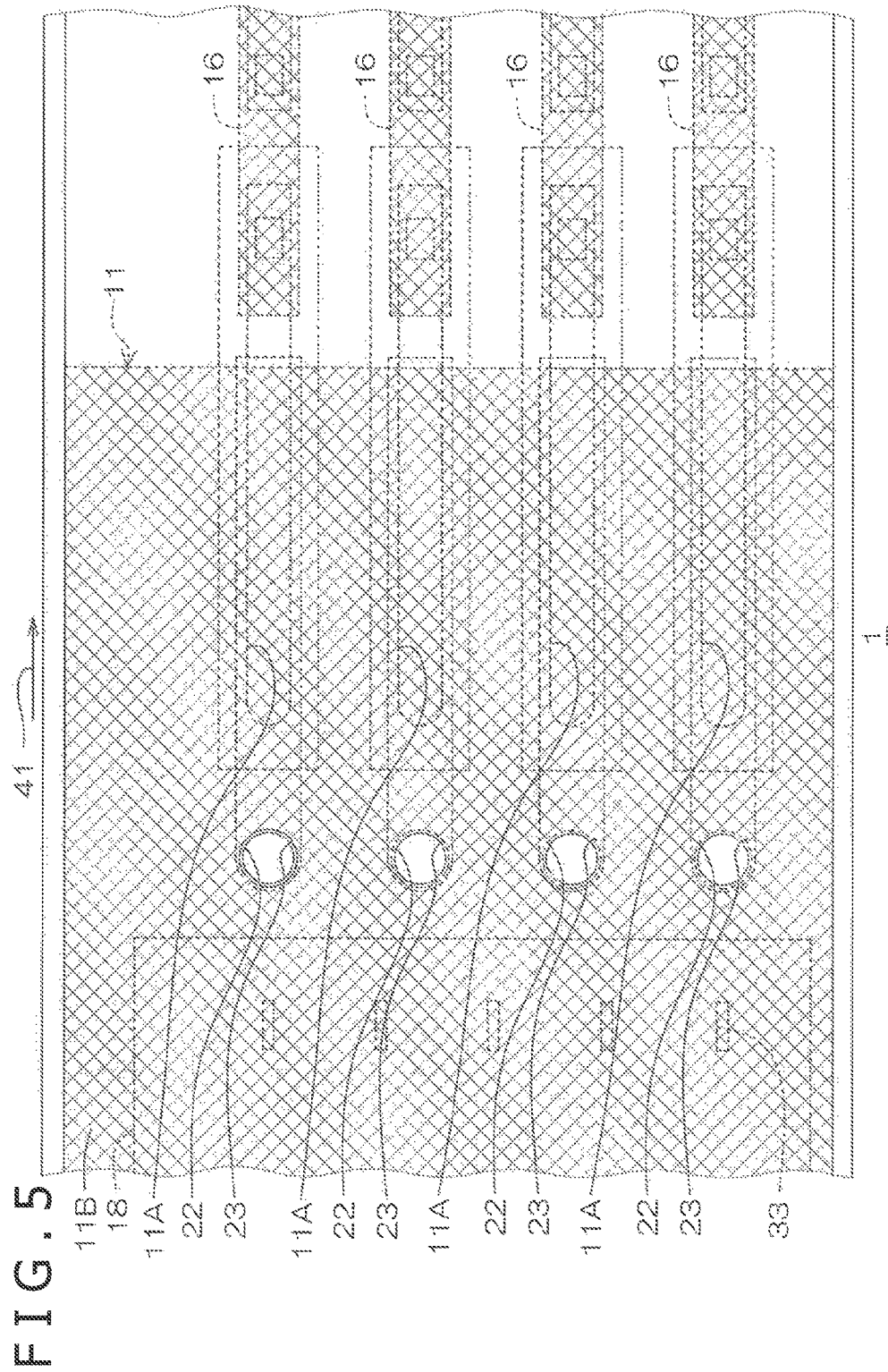

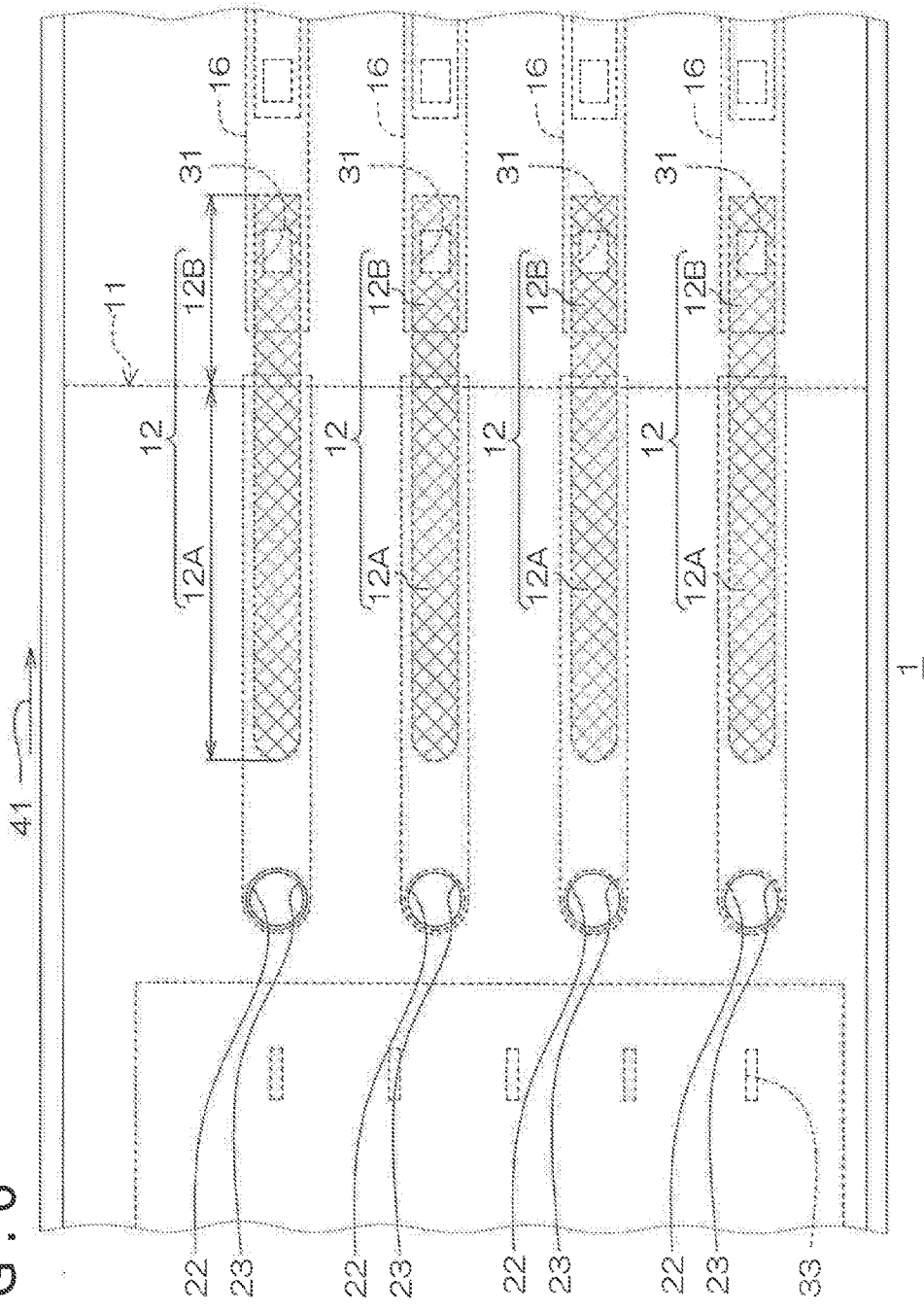

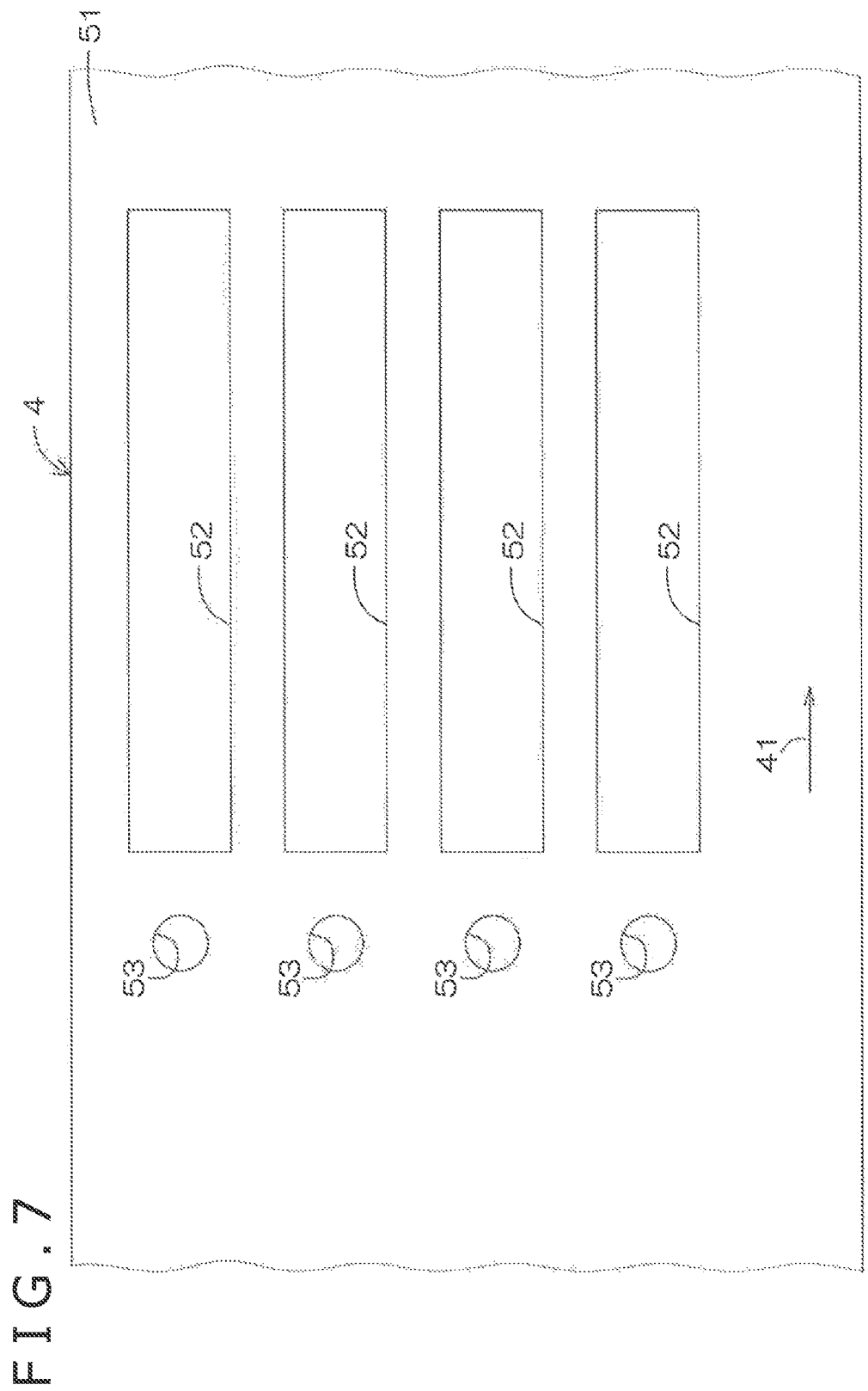

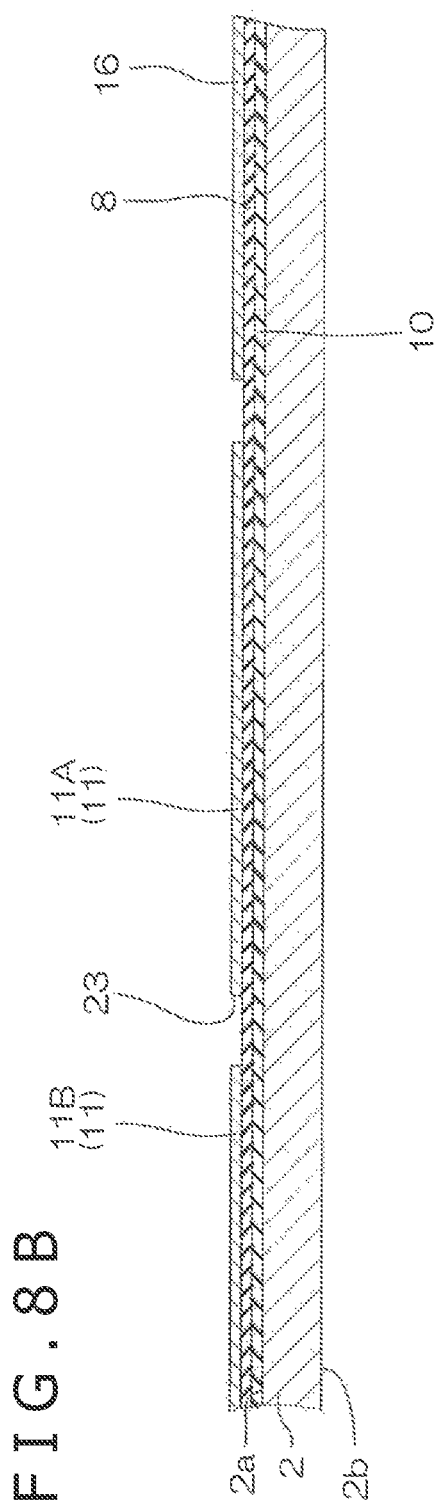

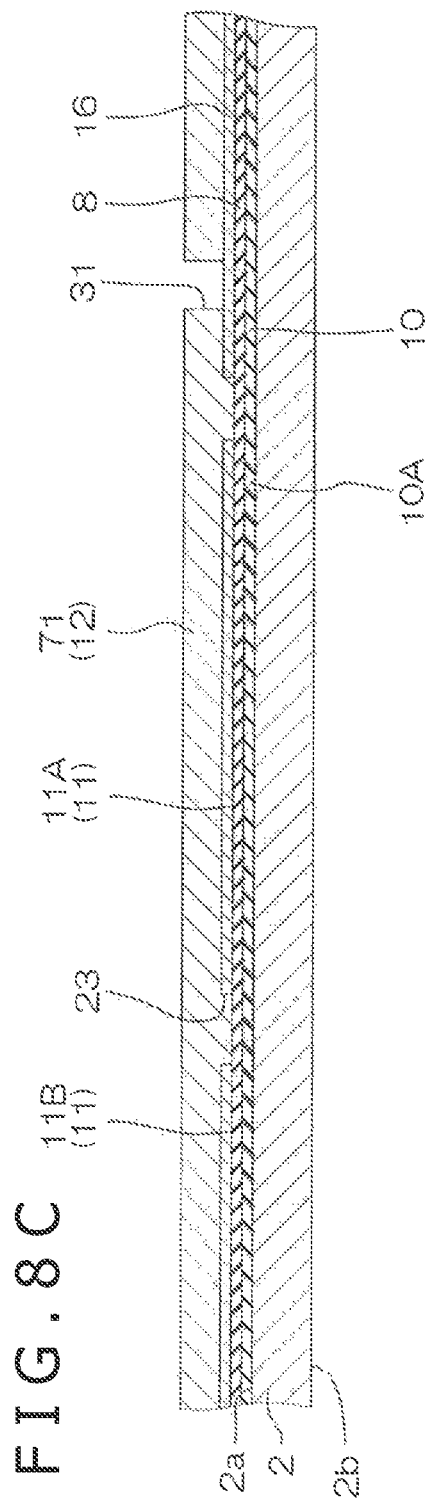

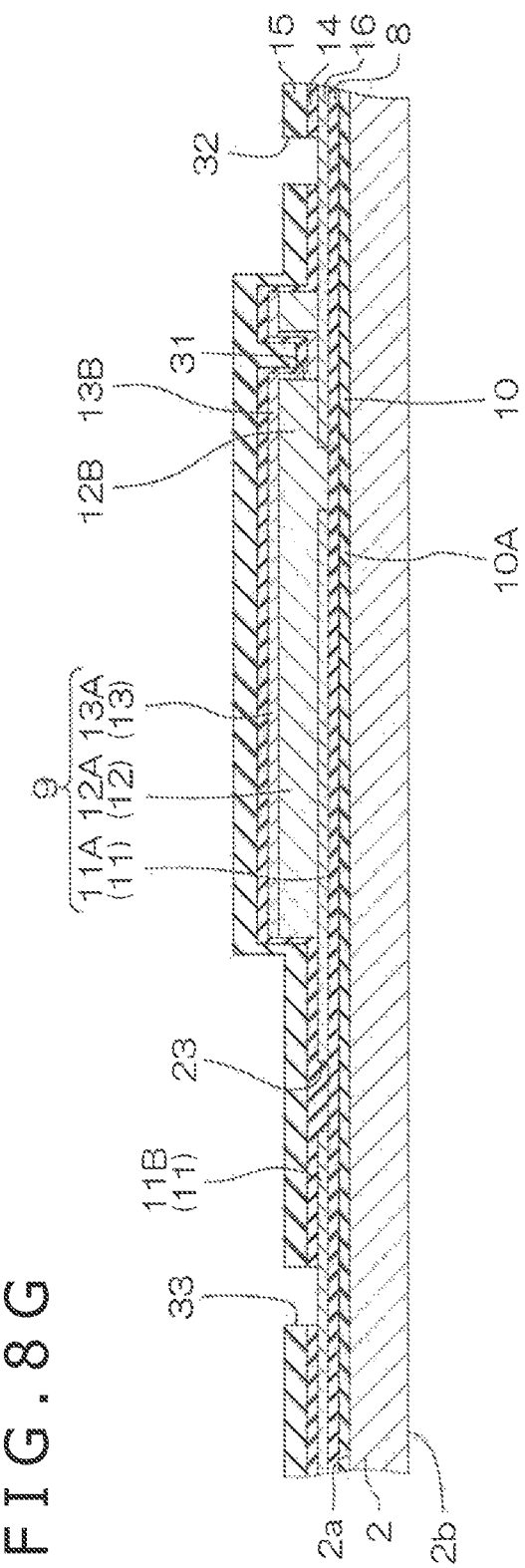

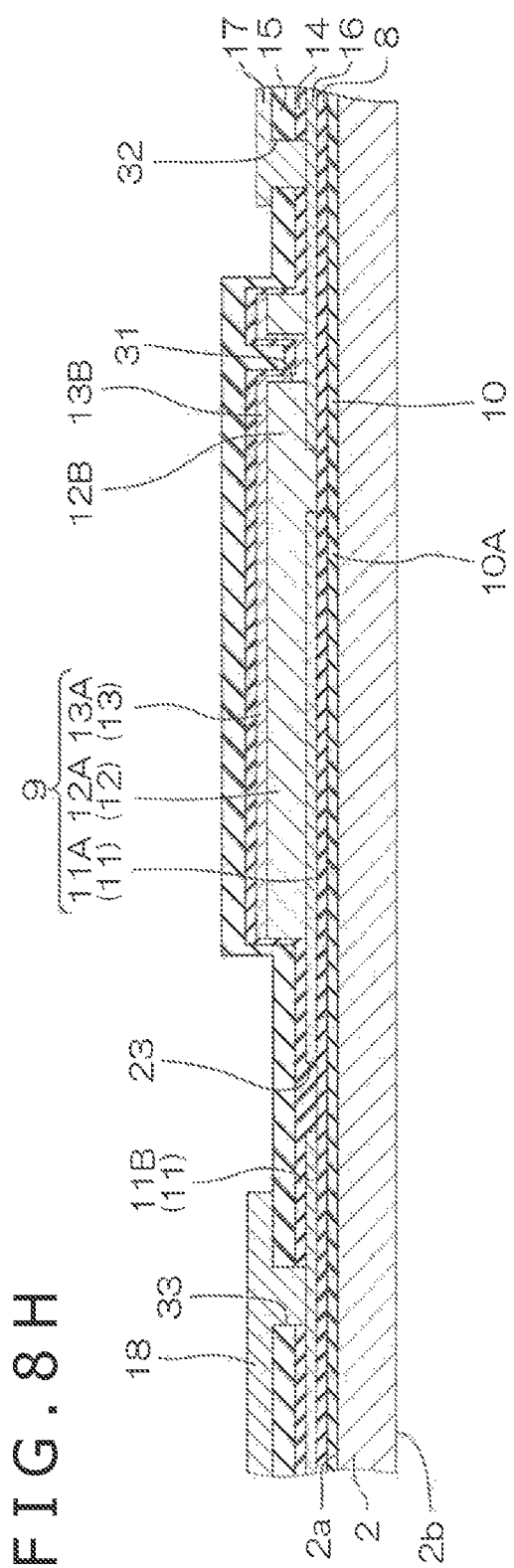

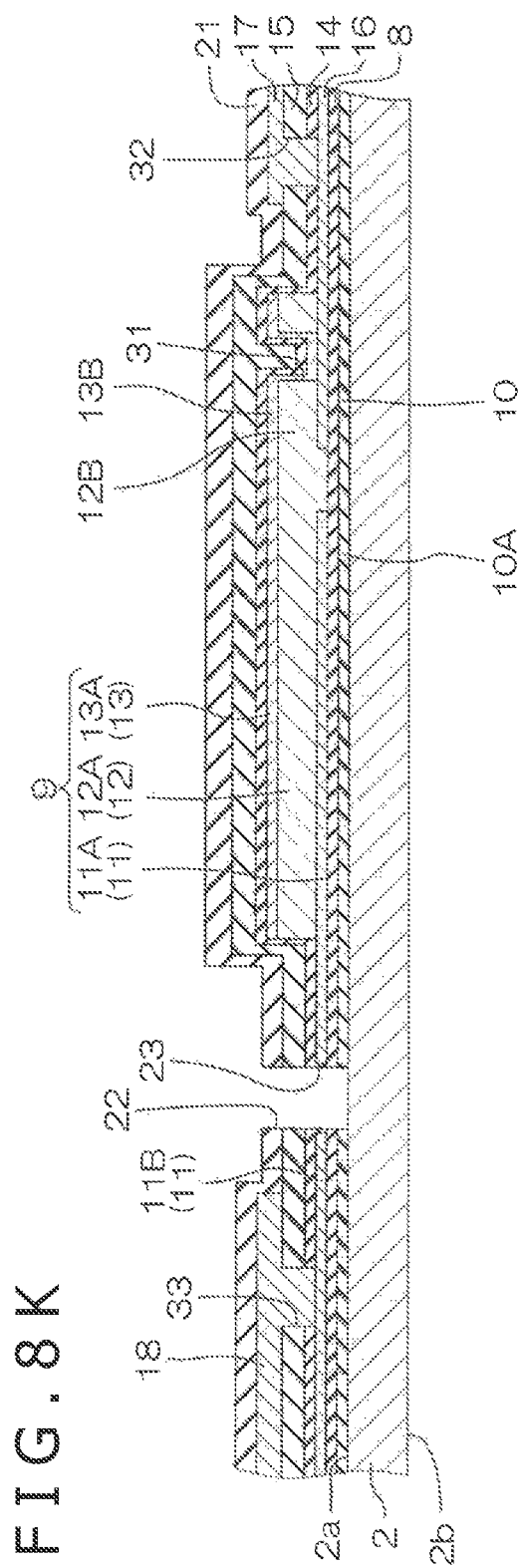

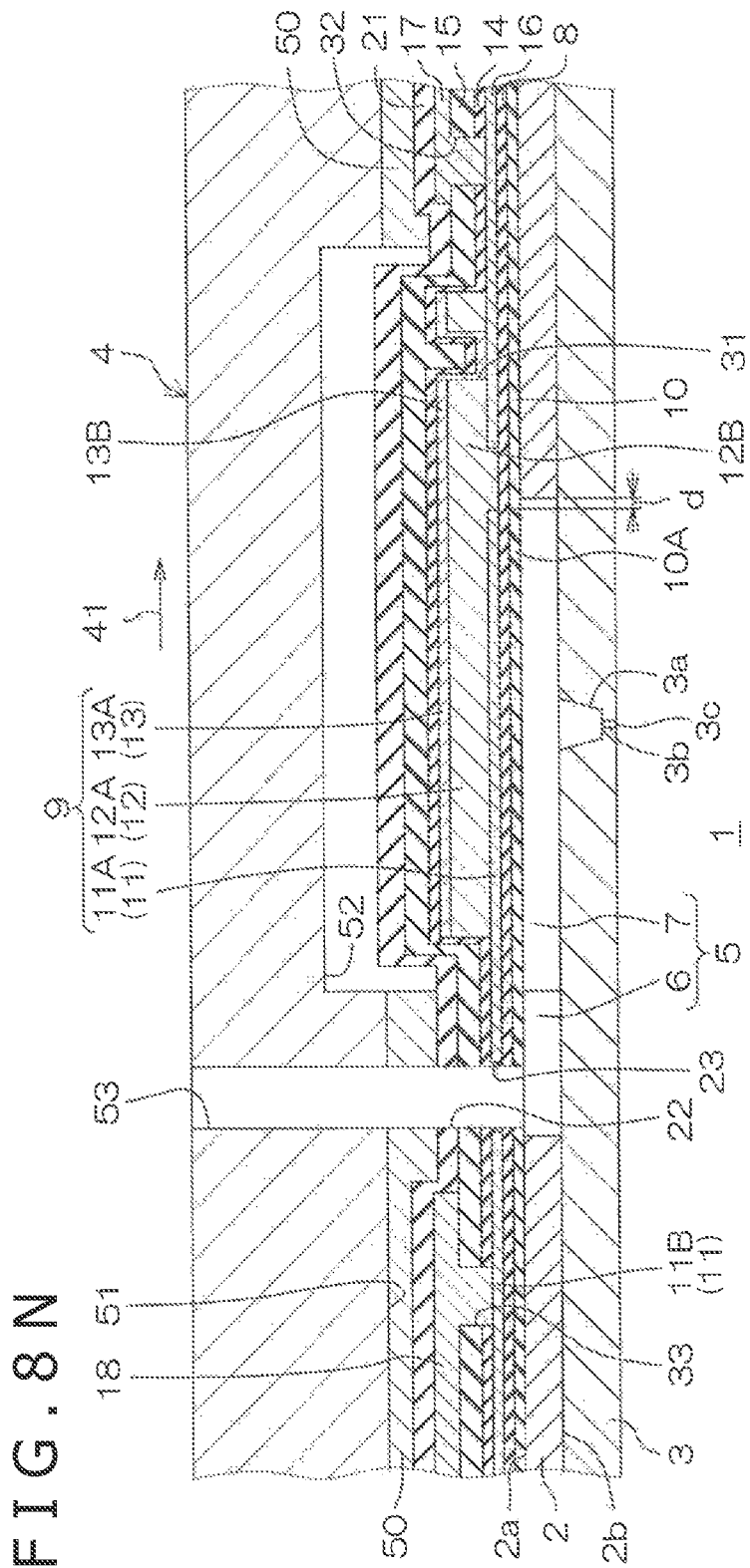

DEVICE USING A PIEZOELECTRIC ELEMENT AND METHOD FOR MANUFACTURING THE SAME

CROSS REFERENCE TO RELATED APPLICATIONS

This US. application claims priority benefit of Japanese Patent Application No. JP 2016-153901 filed in the Japan Patent Office on Aug. 4, 2016. Each of the above-referenced applications is hereby incorporated herein by reference in its entirety.

BACKGROUND OF THE INVENTION

1. Field of the Invention

This invention relates to a device using a piezoelectric element and a method for manufacturing the same.

2. Description of the Related Art

Japanese Patent Laid-Open No. 2013-119182 discloses an ink jet print head utilizing a piezoelectric element. The ink jet print head according to Japanese Patent Laid-Open No. 2013-119182 is equipped with an actuator substrate having a pressure chamber (cavity), a movable film supported by the actuator substrate so as to be opposite the pressure chamber, and a piezoelectric element bonded to the movable film. The piezoelectric element is formed by stacking together, from the movable film side, a lower electrode, a piezoelectric film, and an upper electrode. The entire upper surface region and the entire side surface region of the piezoelectric element are covered with a hydrogen barrier film including Al2O3 (alumina). Formed on the hydrogen barrier film is an insulation film (inter-layer insulation film) including SiO2.

Formed on the insulation film is wiring connected to the upper electrode. One end portion of the wiring is arranged above one end portion of the upper electrode. Between the wiring and the upper electrode, there is formed a contact hole successively extending through the hydrogen barrier film and the insulation film an exposing a part of the upper electrode. One end portion of the wiring enters the contact hole, and is connected to the upper electrode within the contact hole. The wiring extends from above the upper electrode across the outer edge of the pressure chamber to the exterior of the pressure chamber. Formed on the insulation film is a passivation film (surface protection film) covering the upper wiring and including SiN.

SUMMARY OF THE INVENTION

The inventor of preferred embodiments of the present invention described and claimed in the present application conducted an extensive study and research regarding a device using a piezoelectric element and a method for manufacturing the same, such as the one described above, and in doing so, discovered and first recognized new unique challenges and previously unrecognized possibilities for improvements as described in greater detail below.

In the ink jet print head according to Japanese Patent Laid-Open No. 2013-119182, a passivation film including SiN and covering the wiring is formed on the insulation film. In many cases, such a passivation film is formed by plasma CVD (chemical vapor deposition). When the passivation film including SiN is formed by plasma CVD, hydrogen is generated through the following chemical reaction. $3SiH4+4NH3 \rightarrow Si3N4+12H2$ At the time of the formation of the passivation film, substantially the entire region of the surface of the piezoelectric element is covered with the hydrogen barrier film and the insulation film. However, the portion of the surface of the piezoelectric element where the contact hole is formed in the hydrogen barrier film and the insulation film is not covered with the hydrogen barrier film. Thus, the hydrogen generated at the time of the formation of the passivation film passes and contact hole and the upper electrode to reach the piezoelectric film. As a result, the piezoelectric film undergoes hydrogen reduction. As a result, there is a fear of breakdown voltage failure of the piezoelectric film being generated and of deterioration in the Hysteresis (polarization) characteristic of the piezoelectric film being generated.

It is an object of this invention to provide a device using a piezoelectric element and a method of manufacturing the same allowing prevention of the piezoelectric film undergoing hydrogen reduction when the passivation film is formed.

In order to overcome the previously unrecognized and unsolved challenges described above, a preferred embodiment of the present invention provides a device using a piezoelectric element. According to an embodiment of this invention, there is provided a device using a piezoelectric element. This device using a piezoelectric element includes a cavity, a movable film formation layer arranged on the cavity and including a movable film defining a ceiling surface portion of the cavity, a piezoelectric element formed on the movable film and including a lower electrode, a piezoelectric film formed on the lower electrode, and an upper electrode formed on the piezoelectric film, and first upper wiring arranged on the movable film formation layer and in the outer region of a peripheral edge of the ceiling surface portion of the cavity in plan view as seen from the direction of the normal with respect to a main surface of the movable film. The upper electrode includes a main electrode portion constituting the piezoelectric element and an extension portion as second upper wiring drawn out of the main electrode portion and connected to the first upper wiring. The first upper wiring has a portion arranged between the extension portion and the movable film formation layer, and, within this portion, the extension portion is connected to the first upper wiring.

In this construction, when the hydrogen barrier film covering the upper surface and the side surface of the upper electrode is formed, there is no need to form in the hydrogen barrier film a contact hole exposing the upper electrode in order to connect the upper wiring to the upper electrode. Thus, when forming the passivation film, the whole of the upper surface and side surface of the upper electrode can be covered with the hydrogen barrier film. As a result, it is possible to prevent the hydrogen generated at the time of the formation of the passivation film from passing the contact hole exposing the upper electrode and the upper electrode to reach the piezoelectric film. This makes it possible to prevent characteristic deterioration due to the hydrogen reduction of the piezoelectric film at the time the process of forming the passivation film.

In an embodiment of this invention, the piezoelectric element has, in the above-mentioned plan view, a peripheral edge further recessed into the cavity than the movable film. In the above-mentioned plan view, the first upper wiring is formed in the outer region of the peripheral edge of the ceiling surface portion of the cavity on the movable film formation layer. The piezoelectric film includes an active portion constituting the piezoelectric element, and a non-active portion drawn out of the active portion and extending to the first upper wiring. Formed in the non-active portion is a first contact hole extending therethrough in the normal direction with respect to the main surface of the movable film and exposing a part of the first upper wiring. The extension portion of the upper electrode enters the first contact hole from the surface of the non-active portion, and is connected to the first upper wiring within the first contact hole.

In an embodiment of this invention, in the above-mentioned plan view, the ceiling surface portion of the cavity is of a rectangular configuration elongated in one predetermined direction. The first upper wiring is arranged on the outer side of one end of the ceiling surface portion of the cavity in the above-mentioned plan view. In the above-mentioned plan view, the piezoelectric element is of a rectangular configuration elongated in the above-mentioned one direction and having a width shorter than the width in the lateral direction of the ceiling surface portion of the cavity, and a length shorter than the length in the longitudinal direction of the ceiling surface portion of the cavity. Both end edges and both side edges thereof are further recessed into the cavity than both end edges and both side edges of the ceiling surface portion of the cavity. The piezoelectric film includes an active portion constituting the piezoelectric element, and a non-active portion extending, in the above-mentioned plan view, from the first upper wiring side end of the active portion to the first upper wiring astride the corresponding end of the ceiling surface portion of the cavity. Formed in the non-active portion is a first contact hole extending therethrough in the normal direction with respect to the main surface of the movable film and exposing a part of the first upper wiring. The extension portion of the upper electrode enters the first contact hole from the surface of the non-active portion, and is connected to the first upper wiring within the first contact hole. In the above-mentioned plan view, the lower electrode does not exist below the extension portion of the upper electrode on the outer side of the above-mentioned one end of the ceiling surface portion of the cavity.

In an embodiment of this invention, the lower electrode includes a main electrode portion constituting the piezoelectric element, and an extension portion drawn out of the main electrode portion along a surface of an oscillation film formation layer and extending to the outer side of the cavity astride the peripheral edge of the ceiling surface portion of the cavity in the above-mentioned plan view. In the above-mentioned plan view, the main electrode portion is included in an inner electrode region on the inner side of the ceiling surface portion peripheral edge of the cavity of the lower electrode, and the extension portion includes an outer electrode region connected to the inner electrode region and on the outer side of the ceiling surface portion peripheral edge of the cavity of the lower electrode.

In an embodiment of this invention, there are further included a hydrogen barrier film covering the upper surface and the side surface of the upper electrode, the side surface of the piezoelectric film, the upper surface of the upper wiring, and the upper surface of the lower electrode, and an insulation film formed on the hydrogen barrier film. Formed in the hydrogen barrier film and the insulation film are a second contact hole exposing a part of the first upper wiring, and a third contact hole exposing a part of the outer electrode region of the lower electrode. On the insulation film, there are formed third upper wiring connected to the first upper wiring via the second contact hole, and lower wiring connected to the outer electrode region of the lower electrode via the third contact hole.

In an embodiment of this invention, the first upper wiring is formed by the same process as that for forming the lower electrode.

In an embodiment of this invention, the movable film formation layer includes a single SiO2 film.

In an embodiment of this invention, the movable film formation layer includes a laminated film composed of an Si film formed on the substrate, an SiO2 film formed on the Si film, and an SiN film formed on the SiO2 film.

In an embodiment of this invention, the piezoelectric film includes a PZT film.

In an embodiment of this invention, the upper electrode includes a single Pt film.

In an embodiment of this invention, the upper electrode includes a laminated film composed of an IrO2 film formed on the piezoelectric film, and an Ir film formed on the IrO2 film.

In an embodiment of this invention, the lower electrode includes a laminated film composed of a Ti film formed on the movable film side, and a Pt film formed on the Ti film.

In order to overcome the previously unrecognized and unsolved challenges described above, a preferred embodiment of the present invention provides a method for manufacturing a device using a piezoelectric element. According to an embodiment of this invention, there is provided a method of manufacturing a device using a piezoelectric element. This method of manufacturing a device using a piezoelectric element includes the steps of forming a movable film formation layer including a movable film formation region on a substrate in which a cavity is to be formed, forming an electrode/wiring film on the movable film formation layer and then performing patterning on the electrode/wiring film to form a lower electrode and, at the same time, forming first upper wiring in an outer region of the movable film formation region, forming a piezoelectric material film on the movable film formation layer and then forming a first contact hole reaching the first upper wiring from the surface of the piezoelectric material film to thereby form a predetermined intermediate pattern piezoelectric material film, forming an upper electrode film on the movable film formation layer and then performing patterning on the upper electrode film to thereby form a main electrode portion and an upper electrode including an extension portion as second upper wiring drawn out of the main electrode portion and connected to the first upper wiring via the first contact hole, and performing patterning on the intermediate pattern piezoelectric material film to form a piezoelectric film including an active portion in contact with a lower surface of a main electrode portion of the upper electrode, and a non-active portion which has the first contact hole and the surface of which including the side surface of the first contact hole is covered with the extension portion of the upper electrode, wherein by the step of forming the piezoelectric film, there is formed a piezoelectric element including the lower electrode, the main electrode portion of the upper electrode, and the active portion held between them.

According to this method, the upper surface and the side surface of the upper electrode are covered with a hydrogen barrier film, and then the upper wiring is connected to the upper electrode, so that there is no need to form a contact hole leading to the upper electrode in the hydrogen barrier film. Thus, when forming the passivation film, it is possible to cover the upper surface and the side surface of the upper electrode with the hydrogen barrier film. Due to this arrangement, it is possible to prevent the hydrogen generated at the time of the formation of the passivation film from passing through the contact hole leading to the upper electrode and the upper electrode to reach the piezoelectric film. As a result, it is possible to prevent deterioration in characteristic due to the hydrogen reduction of the piezoelectric film at the time of the process of forming the passivation film.

In an embodiment of this invention, the lower electrode includes a main electrode portion in contact with the lower surface of the active portion, and an extension portion drawn out of the main electrode portion along the surface of the oscillation film formation layer and extending, in the above-mentioned plan view, to the exterior of the cavity astride the peripheral edge of the ceiling surface portion of the cavity. In the above-mentioned plan view, the main electrode portion of the lower electrode is included in an inner side electrode region on the inner side of the peripheral edge of the ceiling surface portion of the cavity of the lower electrode, and the extension portion of the lower electrode includes an outer side electrode region connected to the inner side electrode region and on the outer side of the peripheral edge of the ceiling surface portion of the cavity of the lower electrode.

In an embodiment of this invention, there are further included the steps of forming, after the step of forming the piezoelectric film, a hydrogen barrier film covering the piezoelectric element, the lower electrode, and the first upper wiring on the movable film formation layer, covering the hydrogen barrier film with an insulation film, forming, in the hydrogen barrier film and the insulation film, a second contact hole exposing a part of the first upper wiring, and a third contact hole exposing a part of the outer side electrode region of the lower electrode, and forming, on the insulation film, third upper wiring connected to the first upper wiring via the second contact hole, and lower wiring connected to the outer side electrode region of the lower electrode via the third contact hole.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is an enlarged explanatory sectional view of a part of a section taken along line IV-IV of FIG. 1;

FIG. 5 is an explanatory plan view of a lower electrode of the ink jet print head and a pattern example of first upper wiring;

FIG. 6 is an explanatory plan view of a pattern example of a piezoelectric film of the ink jet print head;

FIG. 7 is a bottom view of a principal portion of the protective substrate as seen from the ink jet print head actuator substrate side;

FIG. 8B is a sectional view illustrating the step succeeding to that of FIG. 8A;

FIG. 8C is a sectional view illustrating the step succeeding to that of FIG. 8B;

FIG. 8G is a sectional view illustrating the step succeeding to that of FIG. 8F;

FIG. 8H is a sectional view illustrating the step succeeding to that of FIG. 8G;

FIG. 8K is a sectional view illustrating the step succeeding to that of FIG. 8J;

FIG. 8N is a sectional view illustrating the step succeeding to that of FIG. 8M.

DETAILED DESCRIPTION OF THE PREFERRED EMBODIMENTS

In the following, an embodiment of the present invention will be described in detail with reference to the attached drawings.

Figure 1:
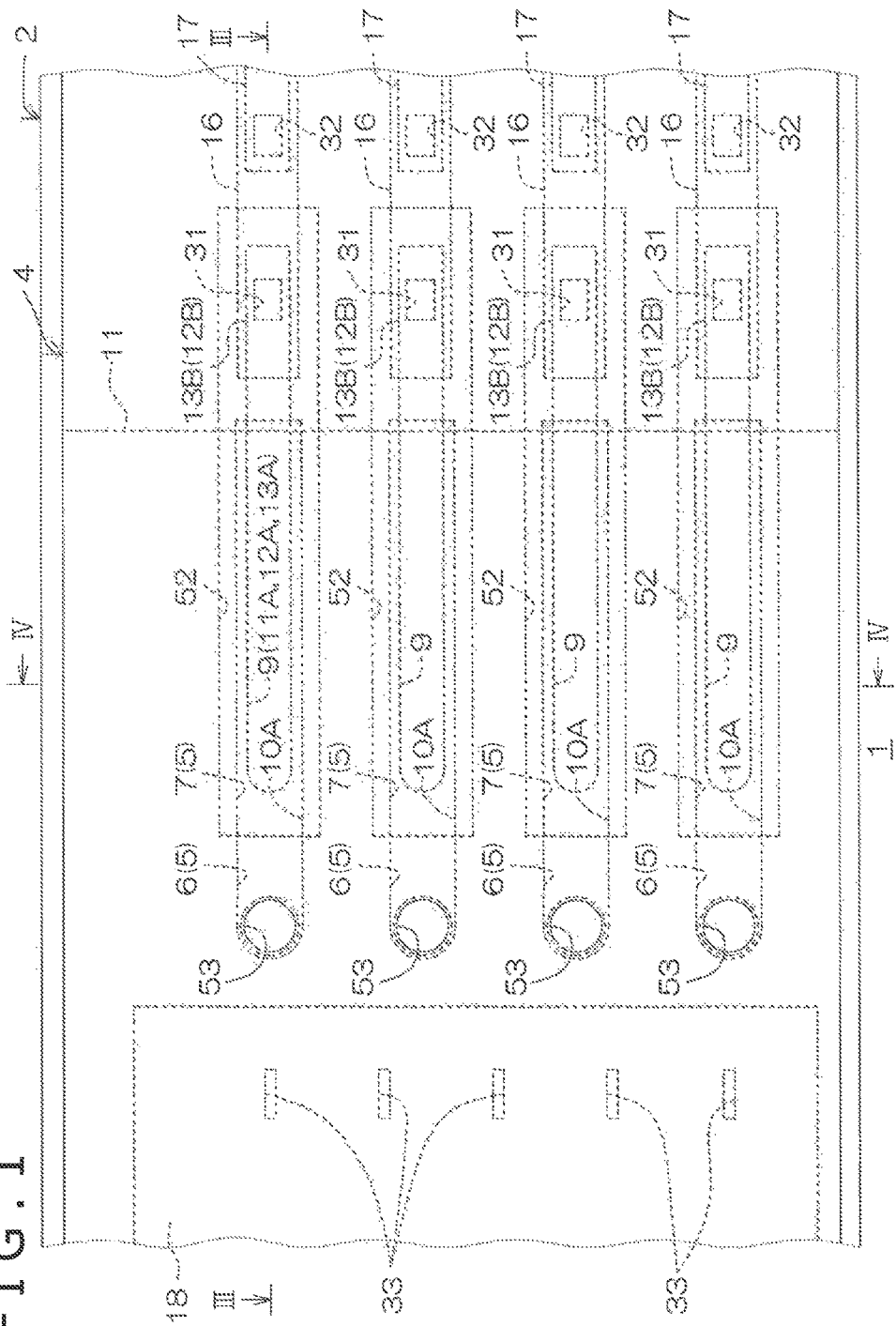
FIG. 1 is an explanatory plan view for illustrating the construction of a principal portion of an ink jet print head according to an embodiment of this invention.
Figure 2:
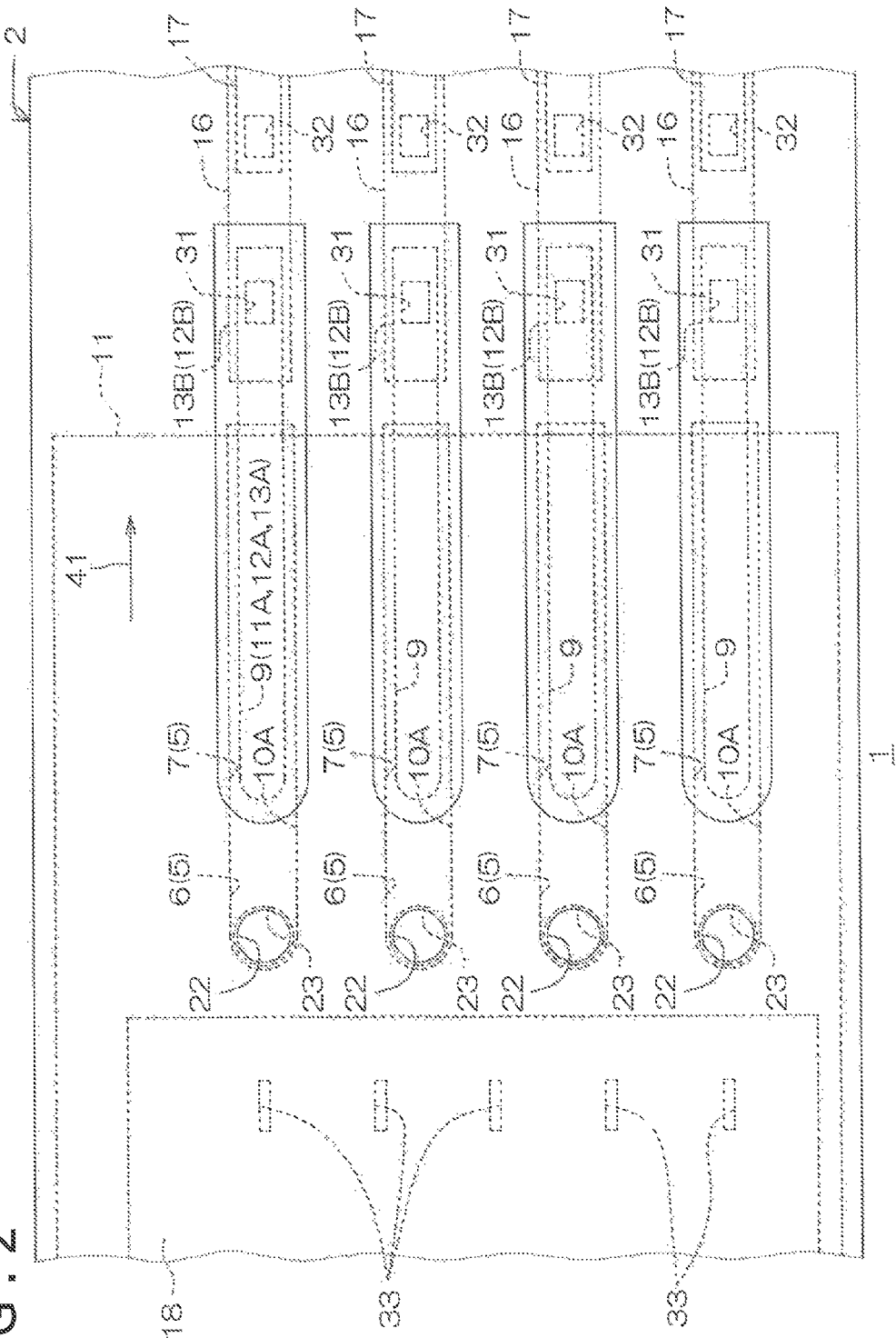
FIG. 2 is an explanatory plan view of the principal portion of the above ink jet print head, with a protective substrate being omitted.
Figure 3:
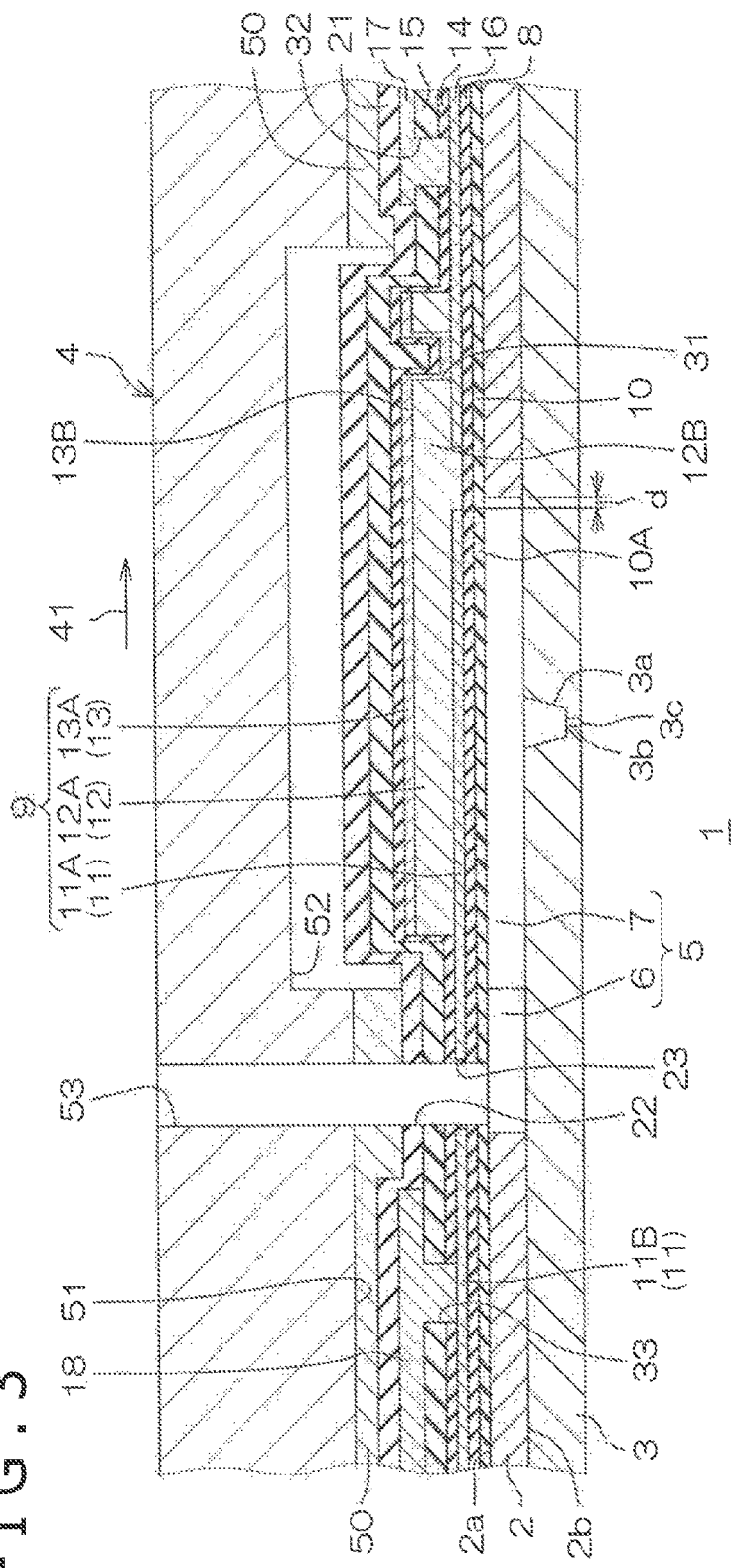
FIG. 3 is an explanatory sectional view taken along line III-III of FIG. 1.

FIG. 1 is an explanatory plan view for illustrating the construction of a principal portion of an ink jet print head according to an embodiment of this invention. FIG. 2 is an explanatory plan view of the principal portion of the above ink jet print head, with a protective substrate being omitted. FIG. 3 is an explanatory sectional view taken along line III-III of FIG. 1. FIG. 4 is an enlarged explanatory sectional view of a part of a section taken along line IV-IV of FIG. 1. FIG. 5 is an explanatory plan view of a lower electrode of the ink jet print head and a pattern example of first upper wiring. FIG. 6 is an explanatory plan view of a pattern example of a piezoelectric film of the ink jet print head.

The construction of an ink jet print head 1 will be schematically described with reference to FIG. 3.

The ink jet print head 1 is equipped with an actuator substrate 2, a nozzle substrate 3, and a protective substrate 4. A movable film formation layer 10 is stacked on the surface of the actuator substrate 2. An ink flow path (ink fountain) 5 is formed in the actuator substrate 2. In this embodiment, the ink flow path 5 is formed so as to extend through the actuator substrate 2. The ink flow path 5 is formed as a thin and narrow path extending along an ink flowing direction 41 indicated by the arrow in FIG. 3. The ink flow path 5 is composed of an ink inflow portion 6 at the upstream side end portion (the left-hand end portion in FIG. 3) with respect to the ink flowing direction 41, and a pressure chamber (cavity) 7 communicating with the ink inflow portion 6. In FIG. 3, the boundary between the ink inflow portion 6 and the pressure chamber 7 is indicated by a two-dot chain line.

The nozzle substrate 3 includes, for example, a silicon substrate. The nozzle substrate 3 is attached to a back surface 2b of the actuator substrate 2. The nozzle substrate 3 defines the ink flow path 5 together with the actuator substrate 2 and the movable film formation layer 10. More specifically, the nozzle substrate 3 defines the bottom surface portion of the ink flow path 5. The nozzle substrate 3 has a recess 3a facing the pressure chamber 7, and an ink discharge path 3b is formed in the bottom surface of the recess 3a. The ink discharge path 3b extends through the nozzle substrate 3, and has a discharge port 3c on the side opposite the pressure chamber 7. Thus, when there is a change in the volume of the pressure chamber 7, the ink accumulated in the pressure chamber 7 passes through the ink discharge path 3b to be discharged from the discharge port 3c.

The ceiling wall portion of the pressure chamber 7 of the movable film formation layer 10 constitutes a movable film 10A. The movable film 10A (movable film formation layer 10) includes, for example, a silicon oxide (SiO2) film formed on the actuator substrate 2. The movable film 10A (movable film formation layer 10) may include a laminated film composed, for example, of a silicon (Si) film formed on the actuator substrate 2, a silicon oxide (SiO2) film formed on the silicon film, and a silicon nitride (SiN) film formed on the silicon oxide film. In this specification, the movable film 10A means the ceiling wall portion of the movable film formation layer 10 defining the ceiling surface portion of the pressure chamber 7. Thus, the portion of the movable film formation layer 10 other than the ceiling wall portion of the pressure chamber 7 does not constitute the movable film 10A.

The thickness of the movable film 10A ranges, for example, from 0.4 to 2 μm. In the case where the movable film 10A is formed by a silicon oxide film, the thickness of the silicon oxide film may be approximately 1.2 μm. In the case where the movable film 10A includes a laminated film composed of a silicon film, a silicon oxide film, and a silicon nitride film, the thickness of the silicon film, the silicon oxide film, and the silicon nitride film may be approximately 0.4 μm each.

The pressure chamber 7 is defined by the movable film 10A, the actuator substrate 2, and the nozzle substrate 3. In this embodiment, it is formed substantially as a rectangular parallelepiped. The length of the pressure chamber 7 may, for example, be approximately 800 μm, and the width thereof of may be approximately 55 μm. The ink inflow portion 6 communicates with one end portion in the longitudinal direction of the pressure chamber 7.

A metal barrier film 8 is formed on the surface of the movable film formation layer 10. The metal barrier film 8 includes, for example, Al2O3 (alumina). The thickness of the metal barrier film 8 ranges from approximately 50 to 100 nm. Arranged on the surface of the metal barrier film 8 are a piezoelectric element 9 and first upper wiring 16. The piezoelectric element 9 is arranged on the movable film 10A serving as the ceiling wall of the pressure chamber 7. The first upper wiring 16 is arranged on the downstream side in the ink flowing direction 41 with respect to the pressure chamber 7.

The piezoelectric element 9 is equipped with a lower electrode 11 formed on the metal barrier film 8, a piezoelectric film 12 formed on the lower electrode 11, and an upper electrode 13 formed on the piezoelectric film 12. In other words, the piezoelectric element 9 is formed by holding the piezoelectric film 12 between the upper electrode 13 and the lower electrode 11 from above and below. In plan view, the piezoelectric element 9 is formed by a portion where the lower electrode 11, the piezoelectric film 12, and the upper electrode 13 overlap each other.

The lower electrode 11 has a double-layer structure in which a Ti (titanium) film and a Pt (platinum) film are sequentially stacked together from the metal barrier film 8 side. Apart from this, the lower electrode 11 may be formed by a single film such as an Au (gold) film, a Cr (chromium) film, or an Ni (nickel) film. The lower electrode 11 has a main electrode portion 11A constituting the piezoelectric element 9, and an extension portion 11B extending from the main electrode portion 11A along the surface of the movable film formation layer 10 (metal barrier film 8). The thickness of the lower electrode 11 may, for example, be approximately 0.2 μm.

As the piezoelectric film 12, it is possible, for example, to apply a PZT (PbZrxTi1-xO3: lead titanate zirconate) film formed by the sol-gel process or the sputtering process. This piezoelectric film 12 includes a sintered body of a metal oxide crystal. The piezoelectric film 12 includes an active portion 12A in contact with the upper surface of the main electrode portion 11A of the lower electrode 11, and a non-active portion 12B extending from a part of the peripheral wall of the active portion 12A to the outer side of the peripheral edge of the pressure chamber 7. The non-active portion 12B extends from a part of the peripheral wall of the active portion 12A along the surface of the metal barrier film 8, and the distal end portion thereof is arranged on the first upper wiring 16. At the distal end portion of the non-active portion 12B, there is formed a first contact hole 31 which extends therethrough in the thickness direction and which is of a rectangular configuration in plan view and exposes a part of the first upper wiring 17. The thickness of the piezoelectric film 12 is approximately 1 μm. It is desirable for the thickness of the movable film 10A as a whole to be approximately the same as the thickness of the piezoelectric film 12 or approximately ⅔ of the thickness of the piezoelectric film 12.

The above-mentioned metal barrier film 8 mainly prevents metal elements (Pb, Zr, and Ti when the piezoelectric film 12 includes PZT) from escaping from the piezoelectric film 12, maintaining a satisfactory piezoelectric characteristic of the piezoelectric film 12. At the same time, it prevents a metal from diffusing into the movable film 10A at the time of the formation of the piezoelectric film 12. The metal barrier film 8 also has a function by which it prevents deterioration in characteristics due to the hydrogen reduction of the piezoelectric film 12.

The upper electrode 13 may be a single film of platinum (Pt), or a laminated structure composed, for example, of a conductive oxide film (e.g., IrO2 (iridium oxide) film) and a metal film (e.g., an Ir (iridium) film). The thickness of the upper electrode 13 may, for example, be approximately 0.2 μm. The upper electrode 13 includes a main electrode portion 13A in contact with the upper surface of the active portion 12A, and an extension portion 13B passing from the main electrode portion 13A over the non-active portion 12B to extend to the outer side of the peripheral edge of the pressure chamber 7. The extension portion 13B enters the first contact hole 31, and is connected to the first upper wiring 16 within the first contact hole 31. More specifically, the extension portion 13B is formed so as to cover the upper surface of the non-active portion 12B, the side surface of the first contact hole 31 of the non-active portion 12B, and the region of the upper surface of the first upper wiring 16 facing the first contact hole 31. That is, the extension portion 13B of the upper electrode 13 constitutes second upper wiring for connecting the main electrode portion 13A of the upper electrode 13 to the first upper wiring 16.

A hydrogen barrier film 14 is formed on the exposed surface of the lower electrode 11, the upper electrode 13, the piezoelectric film 12, and the first upper wiring 16. The hydrogen barrier film 14 includes, for example, Al2O3 (alumina). The thickness of the hydrogen barrier film 14 ranges approximately from 50 to 100 nm. The hydrogen barrier film 14 is provided for the purpose of preventing deterioration in the characteristics of the piezoelectric film 12 due to the hydrogen reduction.

An insulation film 15 is stacked on the hydrogen barrier film 14. The insulation film 15 includes, for example, SiO2, low hydrogen SiN or the like. The thickness of the insulation film 15 is approximately 500 nm. On the insulation film 15, there are formed third upper wiring 17 and lower wiring 18. These pieces of wiring 17 and 18 may be formed of a metal material containing Al (aluminum). The thickness of these pieces of wiring 17 and 18 is, for example, approximately 1000 nm (1 μm).

One end portion of the third upper wiring 17 is arranged above the first upper wiring 16 on the downstream side of the non-active portion 12B of the piezoelectric film 12 with respect to the ink flowing direction 41. Between the third upper wiring 17 and the first upper wiring 16, there is formed a second contact hole 32 of a rectangular configuration in plan view and extending successively through the hydrogen barrier film 14 and the insulation film 15. One end portion of the third upper wiring 17 enters the second contact hole 32, and is connected to the first upper wiring 16 within the second contact hole 32. The third upper wiring 17 extends from above the second contact hole 32 to the downstream side with respect to the ink flowing direction 41.

The lower wiring 18 is arranged above the extension portion 11B of the lower electrode 11 on the side opposite the pressure chamber 7 with respect to the ink inflow portion 6 of the ink flow path 5. Between the lower wiring 18 and the extension portion 11B of the lower electrode 11, there are formed a plurality of third contact holes 33 of a rectangular configuration in plan view and successively extending through the hydrogen barrier film 14 and the insulation film 15. Part of the lower wiring 18 enters the third contact holes 33, and is connected to the extension portion 11B of the lower electrode 11 within the third contact holes 33.

On the insulation film 15, there is formed a passivation film 21 covering the wiring 17 and the wiring 18 and the insulation film 15. The passivation film 21 includes, for example, SiN (silicon nitride). The thickness of the passivation film 21 may, for example, be approximately 800 nm.

At the position corresponding to the ink inflow portion 6 side end portion of the ink flow path 5, there is formed an ink supply through-hole 22 extending through the passivation film 21, the insulation film 15, the hydrogen barrier film 14, the lower electrode 11, the metal barrier film 8, and the movable film formation layer 10. Formed in the lower electrode 11 is a through-hole 23 which includes the ink supply through-hole 22 and which is larger than the ink supply through-hole 22. The hydrogen barrier film 14 enters the gap between the through-hole 23 of the lower electrode 11 and the ink supply through-hole 22. The ink supply through-hole 22 communicates with the ink inflow portion 6.

The protective substrate 4 includes, for example, a silicon substrate. The protective substrate 4 is arranged on the actuator substrate 2 so as to cover the piezoelectric element 9. The protective substrate 4 is bonded to the passivation film 21 via an adhesive 50. The protective substrate 4 has an accommodation recess 52 in an opposing surface 51 opposite a surface 2a of the actuator substrate 2. The piezoelectric element 9 is accommodated in the accommodation recess 52. Further, formed in the protective substrate 4 is an ink supply path 53 communicating with the ink supply through-hole 22. The ink supply path 53 extends through the protective substrate 4. On the protective substrate 4, there is arranged an ink tank (not depicted) storing ink.

The piezoelectric element 9 is formed at a position opposite the pressure chamber 7 with the movable film 10A and the metal barrier film 8 therebetween. That is, the piezoelectric element 9 is formed so as to be in contact with the surface of the metal barrier film 8 on the side opposite the pressure chamber 7. Ink is supplied from the ink tank to the pressure chamber 7 via the ink supply path 53, the ink supply through-hole 22, and the ink inflow portion 6, whereby the pressure chamber 7 is filled with ink. The movable film 10A defines the ceiling surface portion of the pressure chamber 7, and faces the pressure chamber 7. The movable film 10A is supported by the portion of the actuator substrate 2 surrounding the pressure chamber 7, and exhibits flexibility allowing deformation in the direction opposite the pressure chamber 7 (in other words, the thickness direction of the movable film 10A).

The third upper wiring 17 and the lower wiring 18 are connected to a drive circuit (not depicted). When a drive voltage is applied to the piezoelectric element 9 from the drive circuit, the piezoelectric film 12 undergoes deformation due to the inverse piezoelectric effect. As a result, the movable film 10A undergoes deformation together with the piezoelectric element 9, whereby the volume of the pressure chamber 7 undergoes a change to thereby pressurize the ink within the pressure chamber 7. The pressurized ink is discharged in a minute droplet from the discharge port 3c via the ink discharge path 3b.

The construction of the ink jet print head 1 will be described in more detail with reference to FIGS. 1, 2, 3, 4, 5 and 6.

In the actuator substrate 2, a plurality of ink flow paths 5 (pressure chambers 7) extend parallel to each other, and are formed in a stripe-like fashion. The plurality of piezoelectric element 9 is arranged for each of the plurality of ink flow paths 5. The ink supply through-hole 22 is provided for each of the plurality of ink flow paths 5. The accommodation recess 52 and the ink supply path 53 of the protective substrate 4 are provided for each of the plurality of ink flow paths 5.

The plurality of ink flow paths 5 are formed at minute equal intervals (e.g., approximately 30 to 350 μm) in their width direction. Each ink flow path 5 extends as a thin and narrow path along the ink flowing direction 41. Each ink flow path 5 is composed of the ink inflow portion 6 communicating with the ink supply through-hole 22 and the pressure chamber 7 communicating with the ink inflow portion 6. In plan view, the pressure chamber 7 is of a rectangular configuration extending thin and narrow along the ink flowing direction 41. That is, the ceiling surface portion of the pressure chamber 7 has two side edges extending along the ink flowing direction 41, and two end edges extending along the direction orthogonal to the ink flowing direction 41. In plan view, the ink inflow portion 6 has substantially the same width as the pressure chamber 7. In plan view, the inner surface of the end portion of the ink inflow portion 6 on the side opposite the pressure chamber 7 is formed in a semicircular configuration. In plan view, the ink supply through-hole 22 is of a circular configuration (see, in particular, FIG. 2).

In plan view, the piezoelectric element 9 has a rectangular configuration elongated in the longitudinal direction of the pressure chamber 7 (movable film 10A). The length in the longitudinal direction of the piezoelectric element 9 is shorter than the length in the longitudinal direction of the pressure chamber 7 (movable film 10A). As depicted in FIG.

2, both end edges along the lateral direction of the piezoelectric element 9 are arranged at a predetermined interval on the inner side with respect to the corresponding end edges of the movable film 10A. Further, the width in the lateral direction of the piezoelectric element 9 is smaller than the width in the lateral direction of the movable film 10A. Both side edges along the longitudinal direction of the piezoelectric element 9 are arranged at a predetermined interval on the inner side with respect to the corresponding side edges of the movable film 10A.

Referring to FIGS. 2, 3, 4, and 5, the lower electrode 11 is formed in substantially the entire region of the main portion of the surface of the movable film formation layer 10 except for the downstream side portion in the ink flowing direction 41. The downstream side end of the lower electrode 11 in the ink flowing direction 41 is situated on the upstream side of the downstream side end in the ink flowing direction 41 of the pressure chamber 7 by a predetermined interval d (see FIG. 3).

The lower electrode 11 is a common electrode commonly used with respect to the plurality of piezoelectric elements 9. The lower electrode 11 includes the main electrode portion 11A constituting the piezoelectric elements 9 and of a rectangular configuration in plan view, and the extension portion 11B drawn out of the main electrode portion 11A in the direction along the surface of the movable film formation layer 10 (metal barrier film 8) and extending to the outer side of the peripheral edge of the ceiling surface portion of the pressure chamber 7. The length in the longitudinal direction of the main electrode portion 11A is shorter than the length in the longitudinal direction of the movable film 10A. Both end edges of the main electrode portion 11A are arranged at a predetermined interval on the inner side with respect to the corresponding end edges of the movable film 10A. Further, the width in the lateral direction of the main electrode portion 11A is smaller than the width in the lateral direction of the movable film 10A. Both side edges of the main electrode portion 11A are arranged at a predetermined interval on the inner side with respect to the corresponding side edges of the movable film 10A.

The extension portion 11B includes the region of the entire region of the lower electrode 11 except for the main electrode portion 11A. In some cases, of the lower electrode 11, the region on the inner side of the peripheral edge of the ceiling surface portion of the pressure chamber 7 in plan view is referred to as the "inner electrode region," and the region on the outer side of the peripheral edge of the ceiling surface portion of the pressure chamber 7 is referred to as the "outer electrode region." The main electrode portion 11A is contained in the inner electrode region. The extension portion 11B is composed of the portion of the inner electrode region other than the main electrode portion 11A and the outer electrode region.

Referring to FIGS. 2, 3, and 6, in plan view, the active portion 12A of the piezoelectric film 12 is formed in a rectangular configuration of the same pattern as the main electrode portion 11A of the lower electrode 11. That is, the length in the longitudinal direction of the active portion 12A of the piezoelectric film 12 is shorter than the length in the longitudinal direction of the movable film 10A. Both end edges of the active portion 12A are arranged at a predetermined interval on the inner side with respect to the corresponding end edges of the movable film 10A. Further, the width in the lateral direction of the active portion 12A is smaller than the width in the lateral direction of the movable film 10A. Both side edges of the active portion 12A are arranged at a predetermined interval on the inner side with respect to the corresponding side edges of the movable film 10A. As depicted in FIG. 6, in plan view, the non-active portion 12B of the piezoelectric film 12 extends from the downstream side end in the ink flowing direction 41 of the active portion 12A to the outer side astride the corresponding one end of the pressure chamber 7. The distal end portion of the non-active portion 12B is arranged on the first upper wiring 16. At the distal end portion of the non-active portion 12B, there is formed the first contact hole 31 of a rectangular configuration in plan view and exposing a part of the first upper wiring 17.

Referring to FIGS. 2 and 3, in plan view, the main electrode portion 13A of the upper electrode 13 is formed in a rectangular configuration of the same pattern as the main electrode portion 11A of the lower electrode 11. The main electrode portion 13A of the upper electrode 13 is formed on the upper surface of the active portion 12A. That is, the length in the longitudinal direction of the main electrode portion 13A of the upper electrode 13 is shorter than the length in the longitudinal direction of the movable film 10A. Both end edges of the main electrode portion 13A are arranged at a predetermined interval on the inner side with respect to the corresponding end edges of the movable film 10A. Further, the width in the lateral direction of the main electrode portion 13A is smaller than the width in the lateral direction of the movable film 10A. Both side edges of the main electrode portion 13A are arranged at a predetermined interval on the inner side with respect to the corresponding side edges of the movable film 10A.

The extension portion 13B of the upper electrode 13 extends to the upper surface of the non-active portion 12B from the downstream side end in the ink flowing direction 41 of the main electrode portion 13A. More specifically, the extension portion 13B is formed so as to cover the upper surface of the non-active portion 12B, the side surface of the first contact hole 31 of the non-active portion 12B, and the region of the upper surface of the first upper wiring 16 facing the first contact hole 31. As a result, the main electrode portion 13A of the upper electrode 13 is connected to the first upper wiring 16 via the extension portion 13B.

Referring to FIGS. 2, 3, and 5, for each piezoelectric element 9, the first upper wiring 16 is arranged on the downstream side in the ink flowing direction 41 of the piezoelectric element 9. Formed in the hydrogen barrier film 14 and the insulation film 15 is the second contact hole 32 exposing a part of each first upper wiring 16. On the insulation film 15, there is arranged one end portion of the third upper wiring 17 so as to cover the second contact hole 32. One end portion of the third upper wiring 17 is connected to the first upper wiring 16 within the second contact hole 32.

As described above, the downstream side end in the ink flowing direction 41 of the lower electrode 11 is situated on the upstream side of the downstream side end in the ink flowing direction 41 of the pressure chamber 7 by the predetermined interval d. Thus, in plan view, on the outer side of the downstream side end in the ink flowing direction 41 of the ceiling surface portion of the pressure chamber 7, the lower electrode 11 does not exist below the extension portion 13B (second upper wiring) of the upper electrode 13. As a result, a satisfactory insulation property is maintained between the extension portion 13B (second upper wiring) of the upper electrode 13 and the lower electrode 11.

In plan view, one end portion of the lower wiring 18 is arranged in the outer electrode region of the extension portion 11B of the lower electrode 11. More specifically, referring to FIGS. 2 and 3, one end portion of the lower wiring 18 is arranged on the side opposite the pressure chamber 7 with respect to the ink inflow portion 6 of the ink flow path 5. One end portion of the lower wiring 18 enters the plurality of third contact holes 33, and is connected to the extension portion 11B of the lower electrode 11 within the third contact holes 33.

FIG. 7 is a bottom view of a principal portion of the protective substrate as seen from the ink jet print head actuator substrate side.

As depicted in FIGS. 1, 3, 4, and 7, in the opposing surface 51 of the protective substrate 4, there are formed a plurality of accommodation recesses 52 in parallel and at intervals in a direction orthogonal to the ink flowing direction 41. In plan view, the plurality of accommodation recesses 52 are arranged at positions opposite the plurality of pressure chambers 7. For each accommodation recess 52, the ink supply path 53 is arranged on the upstream side in the ink flowing direction 41. In plan view, each accommodation recess 52 is formed in a rectangular configuration somewhat larger than the pattern of the upper electrode 13 of the corresponding piezoelectric element 9. In each accommodation recess 52, there is accommodated the corresponding piezoelectric element 9.

In plan view, the ink supply path 53 of the protective substrate 4 is of a circular configuration of the same pattern as the ink supply through-hole 22 on the actuator substrate 2 side. In plan view, the ink supply path 53 is in alignment with the ink supply through-hole 22.

FIGS. 8A, 8B, 8C, 8D, 8E, 8F, 8G, 8H, 8I, 8J, 8K, 8L, 8M and 8N are sectional views illustrating an example of a manufacturing process for the ink jet print head 1, and FIG. 3 is a sectional view corresponding thereto.

Figure 8A:
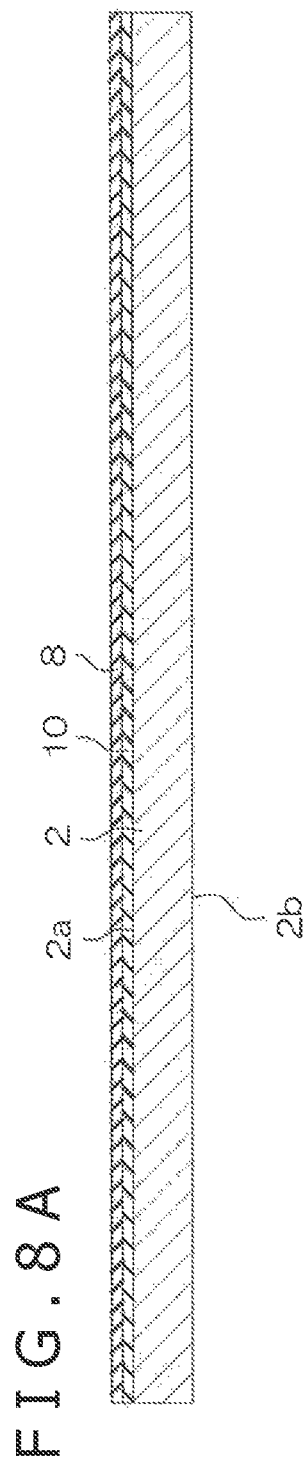
FIG. 8A is a sectional view illustrating an example of a manufacturing process for the ink jet print head.

First, as depicted in FIG. 8A, the movable film formation layer 10 is formed on the surface 2a of the actuator substrate 2. It should be noted, however, that, as the actuator substrate 2, there is used one which is of a larger thickness than the final actuator substrate 2. More specifically, a silicon oxide film (of a thickness of, for example, of 1.2 µm) is formed on the surface of the actuator substrate 2. In the case where the movable film formation layer 10 includes a laminated film composed of a silicon film, a silicon oxide film, and a silicon nitride film, a silicon film (of a thickness, for example, of 0.4 µm) is formed on the surface of the actuator substrate 2, a silicon oxide film (of a thickness, for example, of 0.4 µm) is formed on the silicon film, and a silicon nitride film (of a thickness, for example, of 0.4 µm) is formed on the silicon oxide film.

Next, a metal barrier film 8 is formed on the movable film formation layer 10. The metal barrier film 8 includes, for example, Al2O3 film (of a thickness ranging for example, from 50 to 100 nm). The metal barrier film 8 prevents escapement of metal atoms from a piezoelectric film 12 formed later. When metal atoms escape, there is a fear of the piezoelectric characteristics of the piezoelectric film 12 being deteriorated. Further, when the metal atoms having escaped get mixed in the silicon layer forming the movable film 10A, there is a fear of the durability of the movable film 10A being deteriorated.

Next, on the metal barrier film 8, there is formed an electrode/wiring film which is the material layer of the lower electrode 11 and the first upper wiring 16. The electrode/wiring film includes, for example, a Pt/Ti laminated film having a Ti film (of a thickness ranging, for example, from 10 to 40 nm) as the lower layer, and a Pt film (of a thickness ranging, for example, from 10 to 400 nm) as the upper layer. This electrode/wiring film may be formed by the sputtering method. After this, there is formed a resist mask of the pattern of the lower electrode 11 and the first upper wiring 16 through photolithography. Then, as depicted in FIG. 8B, using this resist mask as the mask, etching is performed on the electrode/wiring film, whereby there are formed the lower electrode 11 of a predetermined pattern and the first upper wiring 16 of a predetermined pattern. As a result, there is formed on the metal barrier film 8 the lower electrode 11 including the main electrode portion 11A and the extension portion 11B having the through-hole 23. Further, a plural pieces of first upper wiring 16 are formed on the metal barrier film 8.

Next, as depicted in FIG. 8C, after the resist mask is peeled off, a material film (piezoelectric material film) 71 of the piezoelectric film 12 is formed on the entire surface. More specifically, there is formed a piezoelectric material film of a thickness ranging from 1 to 3 µm is formed, for example, by the sol-gel method. This piezoelectric material film 71 includes a sintered body of metal oxide crystal granules. After this, through photolithography, a resist mask for forming the first contact hole 31 in the piezoelectric material film 71. By using this resist mask as the mask, etching is performed on the piezoelectric material film 71, whereby a plurality of first contact holes 31 exposing a part of each first upper wiring 16 are formed in the piezoelectric material film 71. As a result, there is formed the piezoelectric material film 71 of the intermediate pattern.

Figure 8D:
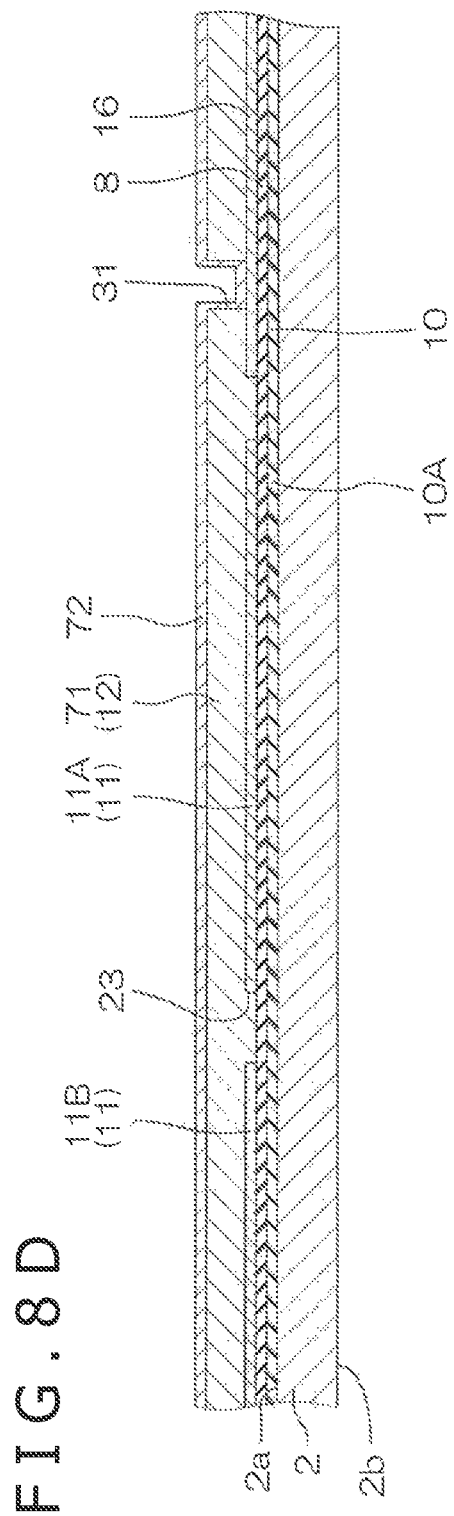
FIG. 8D is a sectional view illustrating the step succeeding to that of FIG. 8C.

Next, as depicted in FIG. 8D, after the resist mask is peeled off, an upper electrode film 72 which is the material of the upper electrode 13 is formed on the entire surface. The upper electrode film 72 may, for example, be a single film of platinum (Pt). The upper electrode film 72 may, for example, be an IrO2/Ir laminated film composed of an IrO2 film (of a thickness ranging, for example, from 40 to 160 nm) as the lower layer and an Ir film (of a thickness ranging, for example, from 40 to 160 nm) as the upper layer. This upper electrode film may be formed by the sputtering method. The upper electrode film 72 is also formed on the side surface of each first contact hole 31 and at the region of the upper surface of the first upper wiring 16 facing each first contact hole 31. As a result, the upper electrode film 72 is electrically connected to the first upper wiring 16.

Figure 8E:
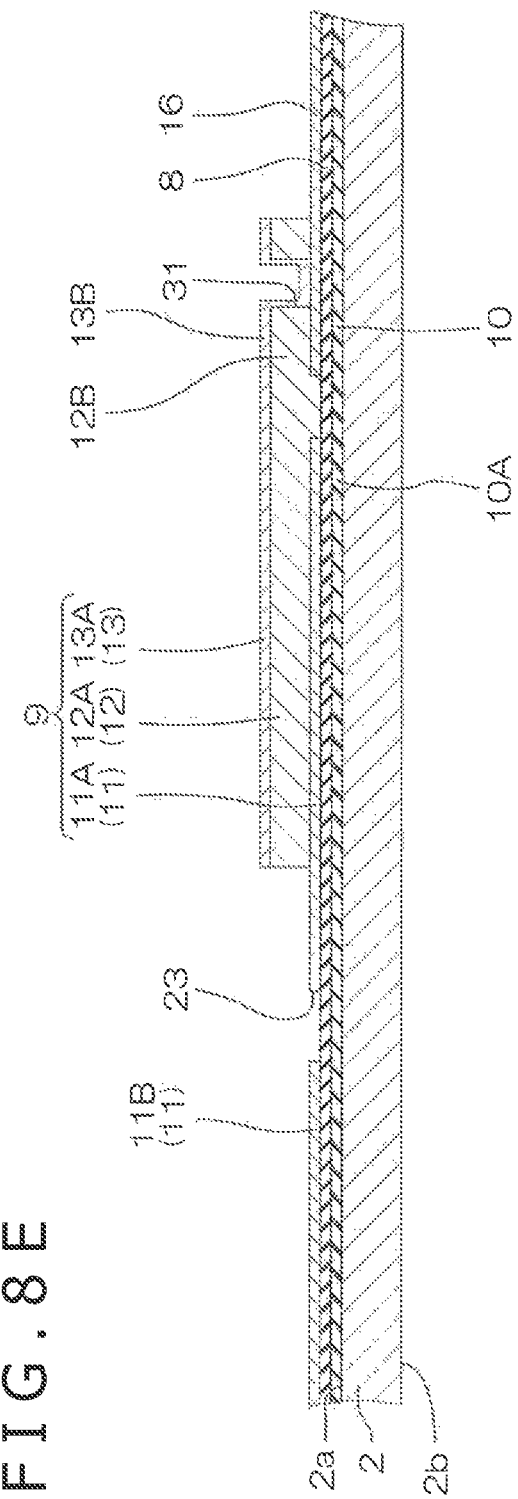
FIG. 8E is a sectional view illustrating the step succeeding to that of FIG. 8D.

Next, there is formed, through photolithography, a resist mask of the pattern of the upper electrode 13 and the piezoelectric film 12. By using this resist mask as the mask, etching is performed on the upper electrode film 72 and the piezoelectric material film 71, whereby, as depicted in FIG. 8E, there are formed the upper electrode 13 and the piezoelectric film 12 of a predetermined pattern. As a result, there are formed the upper electrode 13 including the main electrode portion 13A and the extension portion 13B, and the piezoelectric film 12 including the active portion 12A and the non-active portion 12B. The extension portion 13B of the upper electrode 13 is connected to the first upper wiring 16 via the first contact hole 31 of the non-active portion 12B. In this way, there is formed the piezoelectric element 9 composed of the main electrode portion 11A of the lower electrode 11, the active portion 12A of the piezoelectric film 12, and the main electrode portion 13A of the upper electrode 13.

Figure 8F:
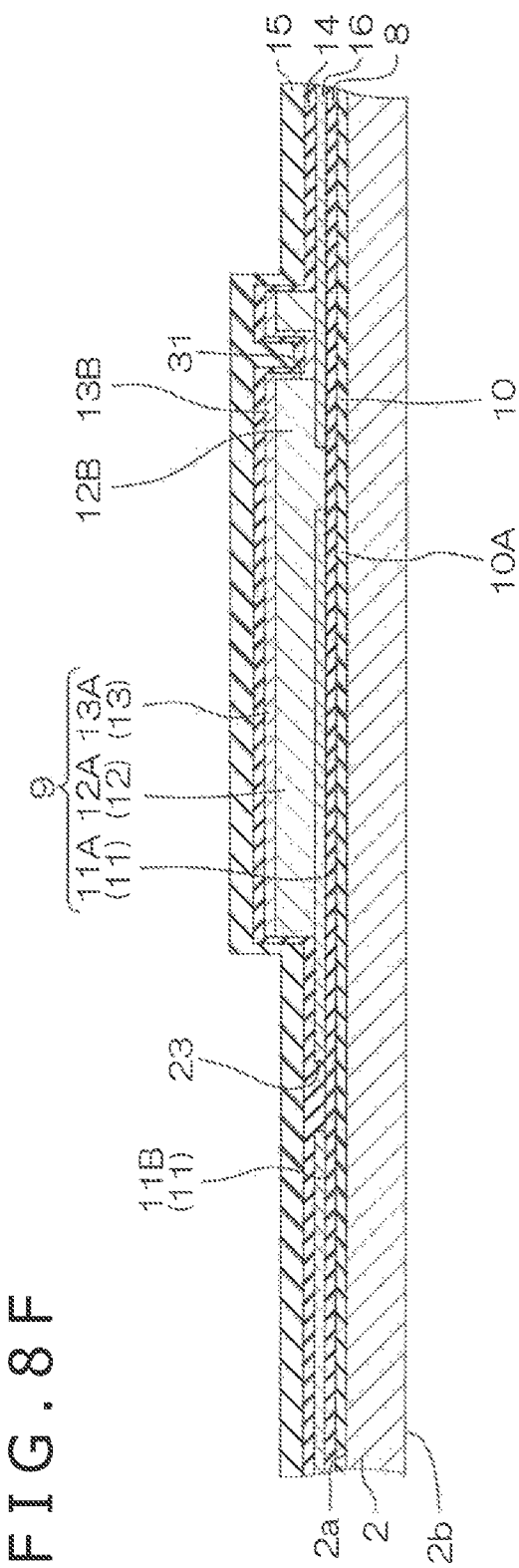
FIG. 8F is a sectional view illustrating the step succeeding to that of FIG. 8E.

Next, as depicted in FIG. 8F, after the resist mask is peeled off, there is formed the hydrogen barrier film 14 covering the entire surface. The hydrogen barrier film 14 may be an Al2O3 film formed by the sputtering method, and the film thickness thereof may range from 50 to 100 nm. After this, the insulation film 15 is formed on the entire surface of the hydrogen barrier film 14. The insulation film 15 may be an SiO2 film, and the thickness thereof may range from 200 to 300 nm.

Next, as depicted in FIG. 8G, the insulation film 15 and the hydrogen barrier film 14 successively undergo etching, whereby the second and third contact holes 32 and 33 are formed.

Next, as depicted in FIG. 8H, a wiring film constituting the third upper wiring 17 and the lower wiring 18 is formed by the sputtering method on the insulation film 15 including the second and third contact holes 32 and 33. After this, patterning is performed on the wiring film through photolithography and etching, whereby the third upper wiring 17 and the lower wiring 18 are formed simultaneously.

Figure 8I:
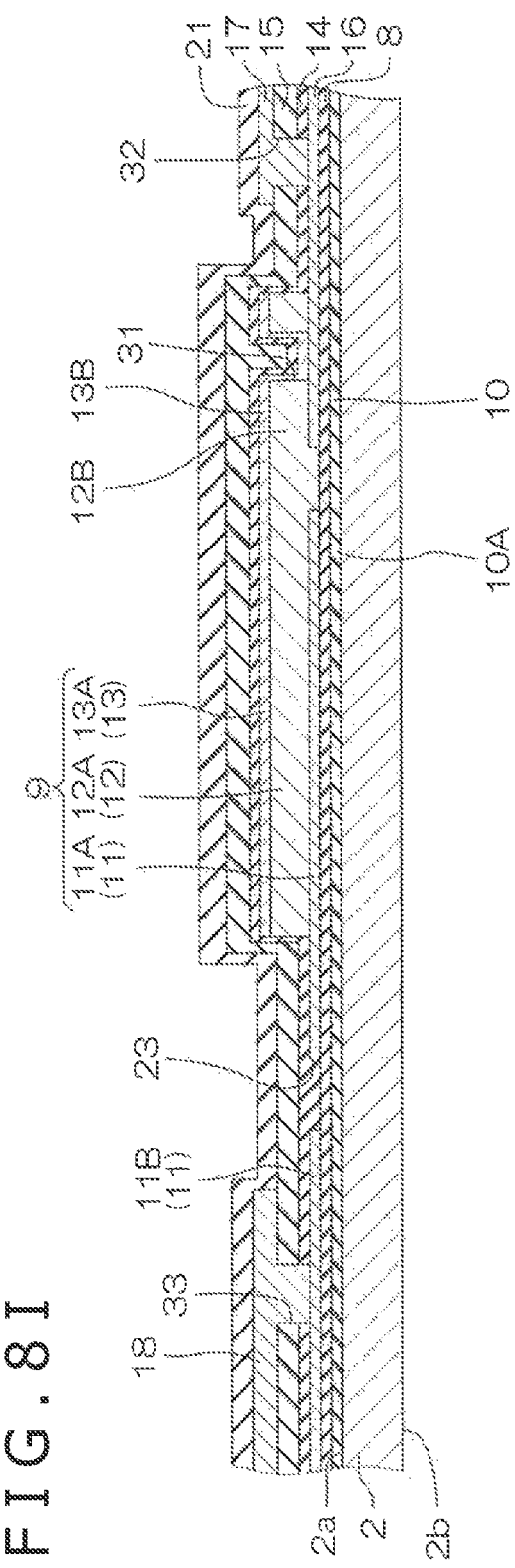
FIG. 8I is a sectional view illustrating the step succeeding to that of FIG. 8H.

Next, as depicted in FIG. 8I, a passivation film 21 covering the wiring 17 and the wiring 18 is formed on the surface of the insulation film 15. The passivation film 21 includes, for example, SiN. The passivation film 21 is formed, for example, by plasma CVD. Hydrogen is generated at the time of the formation of the passivation film 21. Due to this hydrogen, when the piezoelectric film 12 undergoes hydrogen reduction, there is a fear of breakdown voltage failure being generated in the piezoelectric film 12, and there is a fear of deterioration in the hysteresis characteristics of the piezoelectric film.

In this embodiment, the main electrode portion 13A of the upper electrode 13 is connected to the third upper wiring 17 via the extension portion 13B of the upper electrode 13 and the first upper wiring 16. More specifically, the extension portion 13B integrally connected to the main electrode portion 13A of the upper electrode 13 is connected to the first upper wiring 16 via the first contact hole 31 formed in the non-active portion 12B. At a place spaced away from the piezoelectric film 12, the first upper wiring 16 is connected to the third upper wiring 17. In this way, in this embodiment, the connection portion of the upper wiring is not arranged on the upper side of the upper surface of the upper electrode 13, so that there is no need to form in the hydrogen barrier film 14 covering the upper surface of the upper electrode 13 a contact hole exposing a part of the upper electrode 13 for the purpose of connection of the upper electrode 13 to the upper wiring. Thus, in this embodiment, when forming the passivation film 21, it is possible to keep the entire region of the upper surface and side surface of the upper electrode 13 covered with the hydrogen barrier film 14. Thus, it is possible to prevent the hydrogen generated at the time of the formation of the passivation film 21 from reaching the piezoelectric film 12 via the contact hole of the hydrogen barrier film 14. As a result, at the time of the formation of the passivation film 21, it is possible to prevent deterioration in characteristics due to the hydrogen reduction of the piezoelectric film 12.

Figure 8J:
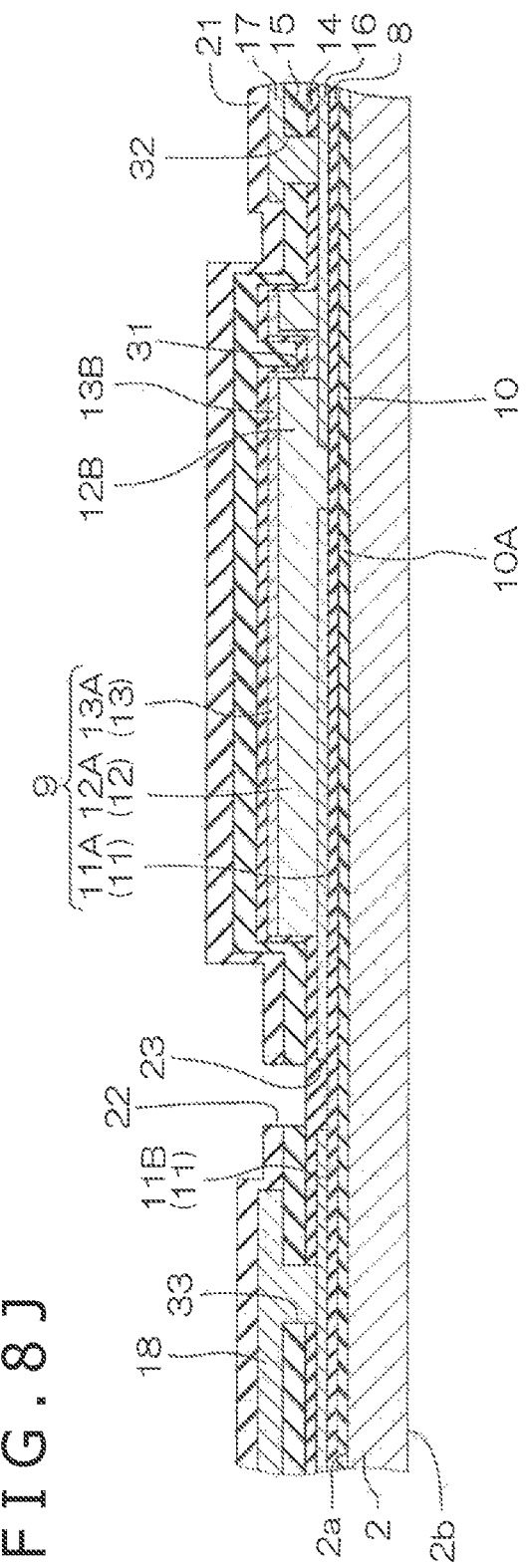
FIG. 8J is a sectional view illustrating the step succeeding to that of FIG. 8I.

Next, a resist mask having an opening corresponding to the ink supply through-hole 22 is formed through photolithography, and, by using this resist mask as the mask, etching is successively performed on the passivation film 21 and the insulation film 15. As a result, as depicted in FIG. 8J, the ink supply through-hole 22 is formed in the passivation film 21 and the insulation film 15.

Next, the resist mask is peeled off. Then, a resist mask having an opening corresponding to the ink supply through-hole 22 is formed through photolithography, and, by using this resist mask as the mask, etching is performed on the hydrogen barrier film 14, the metal barrier film 8, and the movable film formation layer 10. As a result, as depicted in FIG. 8K, the ink supply through-hole 22 is formed in the hydrogen barrier film 14, the metal barrier film 8, and the movable film formation layer 10.

Figure 8L:
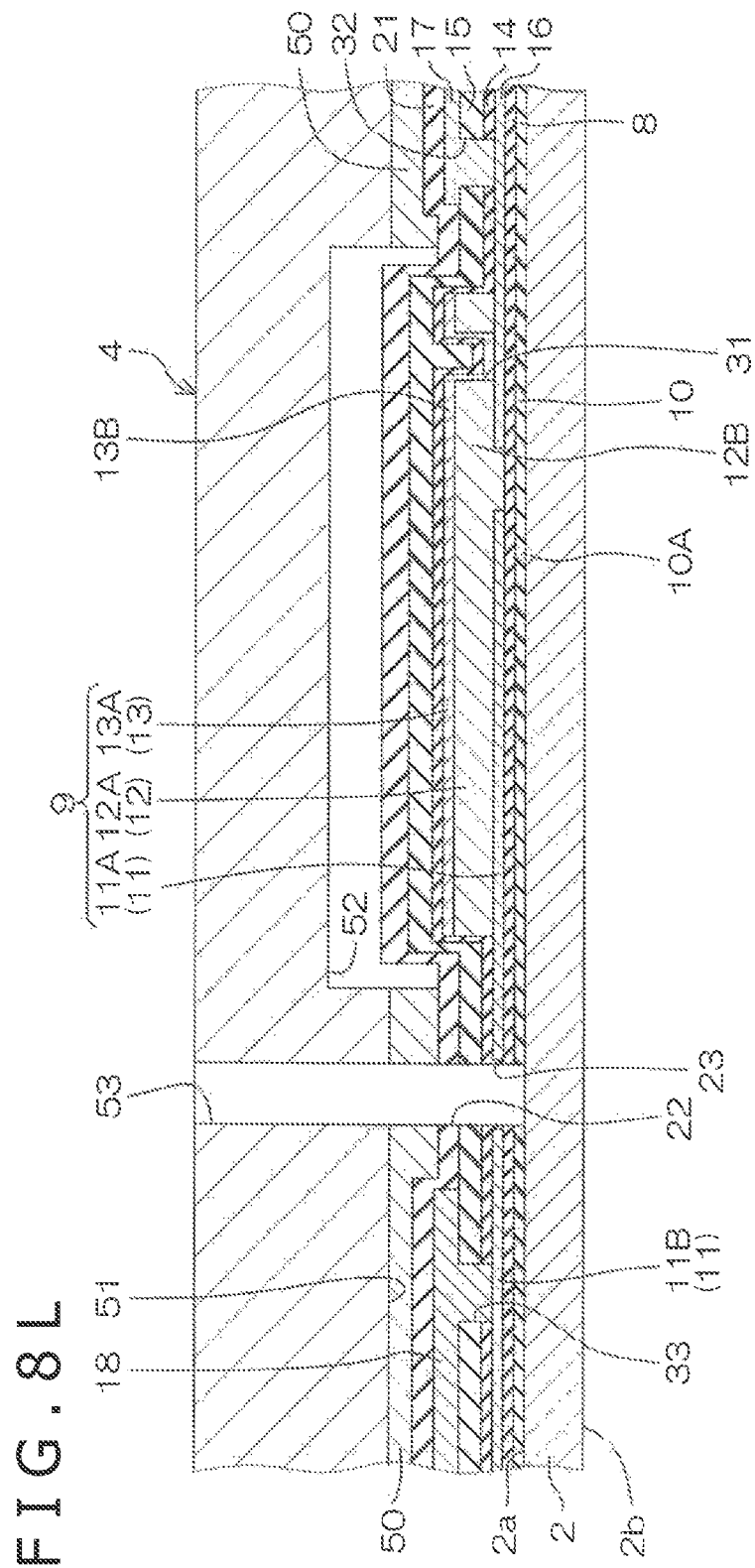
FIG. 8L is a sectional view illustrating the step succeeding to that of FIG. 8K.

Next, as depicted in FIG. 8L, the adhesive 50 is applied to the opposing surface 51 of the protective substrate 4, and the protective substrate 4 is fixed to the actuator substrate 2 such that the ink supply path 53 and the ink supply through-hole 22 are in alignment with each other.

Figure 8M:
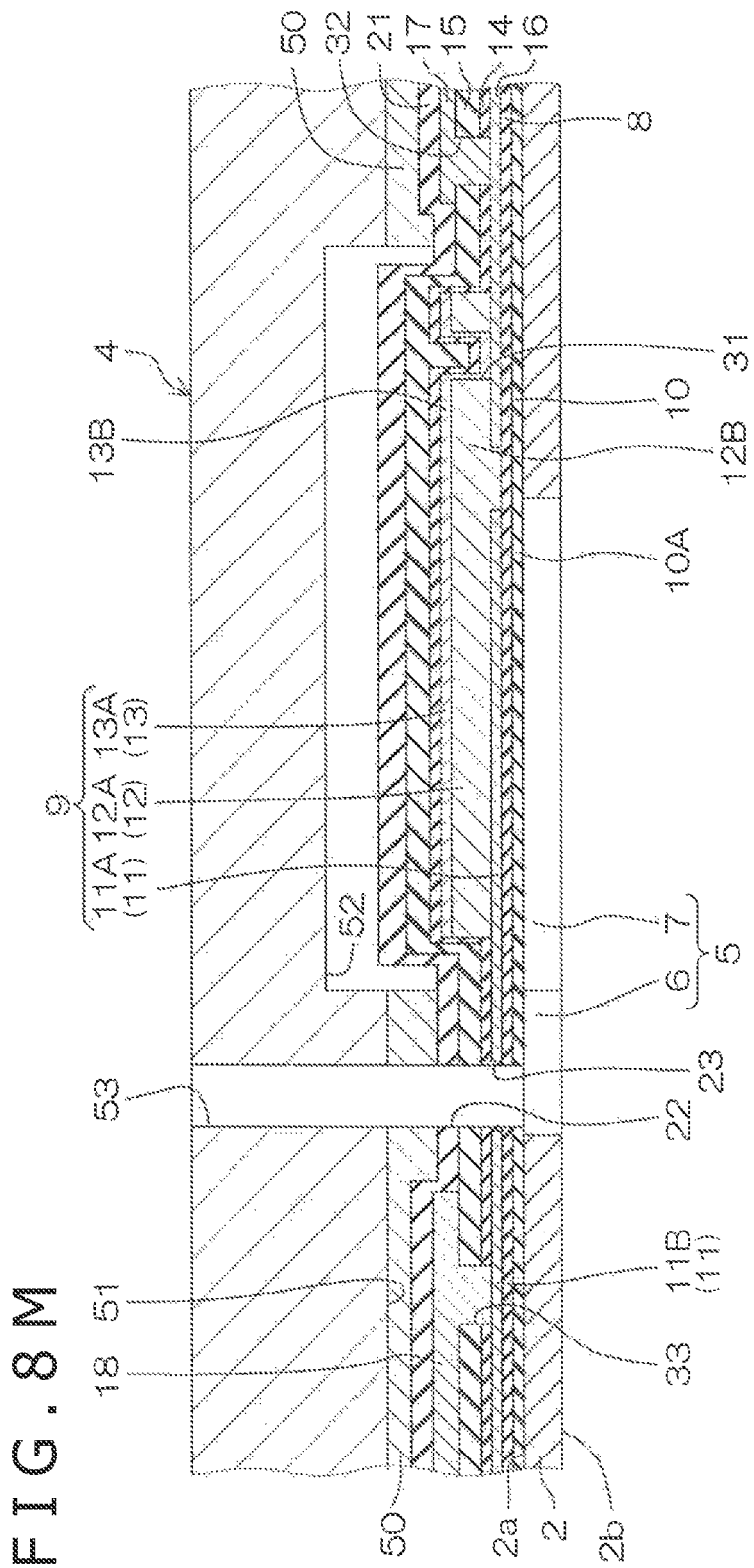
FIG. 8M is a sectional view illustrating the step succeeding to that of FIG. 8L.

Next, as depicted in FIG. 8M, back surface grinding for thinning the actuator substrate 2 is conducted. By grinding the back surface 2b of the actuator substrate 2, the actuator substrate 2 is turned into a thin film. For example, an actuator substrate 2 of a thickness of approximately 670 μm in the initial state may be reduced to a thickness of approximately 300 μm. Next, etching (dry etching or wet etching) is conducted on the back surface of the actuator substrate 2, whereby the ink flow path 5 (the ink inflow portion 6 and the pressure chamber 7) is formed.

At the time of this etching, the metal barrier film 8 prevents escapement of metal elements (Pb, Zr, and Ti in the case of PZT) from the piezoelectric film 12, maintaining a satisfactory piezoelectric characteristic for the piezoelectric film 12. Further, as described above, the metal barrier film 8 contributes to the maintenance of the durability of the silicon layer forming the movable film 10A.

After this, as depicted in FIG. 8N, the nozzle substrate 3 is attached to the back surface of the actuator substrate 2, whereby there is obtained the ink jet print head 1.

The present invention, an embodiment of which has been described above, can be carried out in still another embodiment. For example, while in the above-described embodiment the insulation film 15 is formed on the surface of the hydrogen barrier film 14, the insulation film 15 may be omitted.

Further, while in the above-described embodiment PZT is used as the material of the piezoelectric film, a piezoelectric material including a metal oxide may be applied. Typical examples of the metal oxide include lead titanate (PbPO3), potassium niobate (KNbO3), lithium niobate (LiNbO3), and lithium tantalate (LiTaO3).

This application corresponds to Japanese Patent Application No. 2016-153901 submitted to Japanese Patent Office on Aug. 4, 2016, and the total disclosure of the application is to be incorporated herein through citation.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A device using a piezoelectric element comprising:
a cavity;
a movable film formation layer arranged on the cavity and including a movable film defining a ceiling surface portion of the cavity;
a piezoelectric element formed on the movable film and including a lower electrode, a piezoelectric film formed on the lower electrode, and an upper electrode formed on the piezoelectric film; and
first upper wiring arranged on the movable film formation layer and in the outer region of a peripheral edge of the ceiling surface portion of the cavity in plan view as seen from the direction of the normal with respect to a main surface of the movable film,
wherein the upper electrode includes a main electrode portion constituting the piezoelectric element and an extension portion as second upper wiring drawn out of the main electrode portion and connected to the first upper wiring, and the first upper wiring has a portion arranged between the extension portion and the movable film formation layer, and, within this portion, the extension portion is connected to the first upper wiring.

2. The device using a piezoelectric element according to claim 1, wherein the piezoelectric element has, in the above-mentioned plan view, a peripheral edge further recessed into the cavity than the movable film, in the above-mentioned plan view, the first upper wiring is formed in the outer region of the peripheral edge of the ceiling surface portion of the cavity on the movable film formation layer, the piezoelectric film includes an active portion constituting the piezoelectric element, and a non-active portion drawn out of the active portion and extending to the first upper wiring, formed in the non-active portion is a first contact hole extending therethrough in the normal direction with respect to the main surface of the movable film and exposing a part of the first upper wiring, and the extension portion of the upper electrode is connected to the first upper wiring via the first contact hole.

3. The device using a piezoelectric element according to claim 1, wherein, in the above-mentioned plan view, the ceiling surface portion of the cavity is of a rectangular configuration elongated in one predetermined direction, the first upper wiring is arranged on the outer side of one end of the ceiling surface portion of the cavity in the above-mentioned plan view, in the above-mentioned plan view, the piezoelectric element is of a rectangular configuration elongated in the above-mentioned one direction and having a width shorter than the width in the lateral direction of the ceiling surface portion of the cavity, and a length shorter than the length in the longitudinal direction of the ceiling surface portion of the cavity, with both end edges and both side edges thereof being further recessed into the cavity than both end edges and both side edges of the ceiling surface portion of the cavity, the piezoelectric film includes an active portion constituting the piezoelectric element, and a non-active portion extending, in the above-mentioned plan view, from one end of the first upper wiring side end of the active portion to the first upper wiring astride the corresponding end of the ceiling surface portion of the cavity, formed in the non-active portion is a first contact hole extending therethrough in the normal direction with respect to the main surface of the movable film and exposing a part of the first upper wiring, the extension portion of the upper electrode enters the first contact hole from the surface of the non-active portion, and is connected to the first upper wiring within the first contact hole, and in the above-mentioned plan view, the lower electrode does not exist below the extension portion of the upper electrode on the outer side of the above-mentioned one end of the ceiling surface portion of the cavity.

4. The device using a piezoelectric element according to claim 1, wherein the lower electrode includes a main electrode portion constituting the piezoelectric element, and an extension portion drawn out of the main electrode portion along a surface of an oscillation film formation layer and extending to the outer side of the cavity astride the peripheral edge of the ceiling surface portion of the cavity in the above-mentioned plan view, and the main electrode portion of the lower electrode is included in an inner electrode region on the inner side of the ceiling surface portion peripheral edge of the cavity of the lower electrode, and the extension portion of the lower electrode includes an outer electrode region connected to the inner electrode region and on the outer side of the ceiling surface portion peripheral edge of the cavity of the lower electrode in the above-mentioned plan view.

5. The device using a piezoelectric element according to claim 4, further comprising:

a hydrogen barrier film covering the upper surface and the side surface of the upper electrode, the side surface of the piezoelectric film, the upper surface of the first upper wiring, and the upper surface of the lower electrode; and an insulation film formed on the hydrogen barrier film, wherein, formed in the hydrogen barrier film and the insulation film are a second contact hole exposing a part of the first upper wiring, and a third contact hole exposing a part of the outer electrode region of the lower electrode, and on the insulation film, there are formed third upper wiring connected to the first upper wiring via the second contact hole, and lower wiring connected to the outer electrode region of the lower electrode via the third contact hole.

6. The device using a piezoelectric element according to claim 1, wherein the first upper wiring is formed by the same process as that for forming the lower electrode.

7. The device using a piezoelectric element according to claim 1, wherein the movable film formation layer includes a single SiO2 film.

8. The device using a piezoelectric element according to claim 1, wherein the movable film formation layer includes a laminated film composed of an Si film formed on the substrate, an SiO2 film formed on the Si film, and an SiN film formed on the SiO2 film.

9. The device using a piezoelectric element according to claim 1, wherein the piezoelectric film includes a PZT film.

10. The device using a piezoelectric element according to claim 1, wherein the upper electrode includes a single Pt film.

11. The device using a piezoelectric element according to claim 1, wherein the upper electrode includes a laminated film composed of an $IrO_2$ film formed on the piezoelectric film, and an Ir film formed on the $IrO_2$ film.

12. The device using a piezoelectric element according to claim 1, wherein the lower electrode includes a laminated film composed of a Ti film formed on the movable film side, and a Pt film formed on the Ti film.

13. A method of manufacturing a device using a piezoelectric element comprising the steps of:

forming a movable film formation layer including a movable film formation region on a substrate in which a cavity is to be formed;

forming an electrode/wiring film on the movable film formation layer and then performing patterning on the electrode/wiring film to form a lower electrode and, at the same time, forming first upper wiring in an outer region of the movable film formation region;

forming a piezoelectric material film on the movable film formation layer and then forming a first contact hole reaching the first upper wiring from the surface of the piezoelectric material film to thereby form a predetermined intermediate pattern piezoelectric material film;

forming an upper electrode film on the movable film formation layer and then performing patterning on the upper electrode film to thereby form a main electrode portion and an upper electrode including an extension portion as second upper wiring drawn out of the main electrode portion and connected to the first upper wiring via the first contact hole; and performing patterning on the intermediate pattern piezoelectric material film to form a piezoelectric film including an active portion in contact with a lower surface of a main electrode portion of the upper electrode, and a non-active portion which has the first contact hole and the surface of which including the side surface of the first contact hole is covered with the extension portion of the upper electrode, wherein by the step of forming the piezoelectric film, there is formed a piezoelectric element including the lower electrode, the main electrode portion of the upper electrode, and the active portion held between them.

14. The method of manufacturing a device using a piezoelectric element according to claim 13, wherein the lower electrode includes a main electrode portion in contact with the lower surface of the active portion, and an extension portion drawn out of the main electrode portion along a surface of an oscillation film formation layer and extending, in the above-mentioned plan view, to the exterior of the cavity astride the peripheral edge of the ceiling surface portion of the cavity, in the above-mentioned plan view, the main electrode portion is included in an inner side electrode region on the inner side of the peripheral edge of the ceiling surface portion of the cavity of the lower electrode, and the extension portion includes an outer side electrode region connected to the inner side electrode region and on the outer side of the peripheral edge of the ceiling surface portion of the cavity of the lower electrode.

15. The method of manufacturing a device using a piezoelectric element according to claim 14, further comprising the steps of:

forming, after the step of forming the piezoelectric film, a hydrogen barrier film covering the piezoelectric element, the lower electrode, and the first upper wiring on the movable film formation layer;

covering the hydrogen barrier film with an insulation film;

forming, in the hydrogen barrier film and the insulation film, a second contact hole exposing a part of the first upper wiring, and a third contact hole exposing a part of the outer side electrode region of the lower electrode; and forming, on the insulation film, third upper wiring connected to the first upper wiring via the second contact hole, and lower wiring connected to the outer side electrode region of the lower electrode via the third contact hole.

* * * * *